(12) United States Patent
Hayashi et al.

(10) Patent No.: US 7,205,213 B2
(45) Date of Patent: *Apr. 17, 2007

(54) DEVICE TRANSFERRING METHOD

(75) Inventors: Kunihiko Hayashi, Kanagawa (JP); Yoshiyuki Yanagisawa, Kanagawa (JP); Toshiaki Iwafuchi, Kanagawa (JP); Hisashi Ohba, Kanagawa (JP)

(73) Assignee: Sony Corporation, Tokyo (JP)

( * ) Notice: Subject to any disclaimer, the term of this patent is extended or adjusted under 35 U.S.C. 154(b) by 3 days.

This patent is subject to a terminal disclaimer.

(21) Appl. No.: 11/079,780

(22) Filed: Mar. 14, 2005

(65) Prior Publication Data

US 2005/0158895 A1 Jul. 21, 2005

Related U.S. Application Data

(63) Continuation of application No. 10/297,872, filed as application No. PCT/JP02/03549 on Apr. 9, 2002, now Pat. No. 6,872,635.

(30) Foreign Application Priority Data

| Apr. 11, 2001 | (JP) | ............................ P2001-112401 |
| Jun. 5, 2001 | (JP) | ............................ P2001-169857 |
| Jun. 27, 2001 | (JP) | ............................ P2001-194890 |

(51) Int. Cl.
*H01L 21/201* (2006.01)

(52) U.S. Cl. .................. 438/463; 438/66; 438/464

(58) Field of Classification Search ............ 438/25–26, 438/33, 51, 55, 64–68, 110, 113–114, 128, 438/450–455, 460, 463–464

See application file for complete search history.

(56) References Cited

U.S. PATENT DOCUMENTS

| 5,438,241 | A | * | 8/1995 | Zavracky et al. ......... 315/169.3 |
| 6,872,635 | B2 | * | 3/2005 | Hayashi et al. ............. 438/463 |
| 2002/0171089 | A1 | * | 11/2002 | Okuyama et al. ............. 257/88 |
| 2005/0158094 | A1 | * | 7/2005 | Hayashi et al. ............... 438/22 |
| 2005/0158896 | A1 | * | 7/2005 | Hayashi et al. ............... 438/26 |

* cited by examiner

*Primary Examiner*—Thanhha S. Pham
(74) *Attorney, Agent, or Firm*—Bell, Boyd & Lloyd LLP

(57) ABSTRACT

A method of selectively transferring devices arrayed on a first substrate to a second substrate on which an adhesive resin layer is previously formed is provided. The method includes steps of selectively heating the adhesive resin layer on the second substrate by laser irradiation from the back surface side of the second substrate, and curing the selectively heated portions of the adhesive resin layer, thereby adhesively bonding those to be transferred of the devices to the second substrate. At this time, portions, corresponding to the devices, of the adhesive layer are heated directly or indirectly via the devices or wiring portions by laser irradiation from the back surface side of the substrate. The heated portions of the adhesive resin layer selectively exhibit the adhesive forces. The heated portions of the adhesive layer are then cured, so that only the devices to be transferred are selectively transferred to the second substrate. As a result, only the devices to be transferred can be done so with certainty, efficiency, and accuracy without exerting adverse effect on other parts.

1 Claim, 25 Drawing Sheets

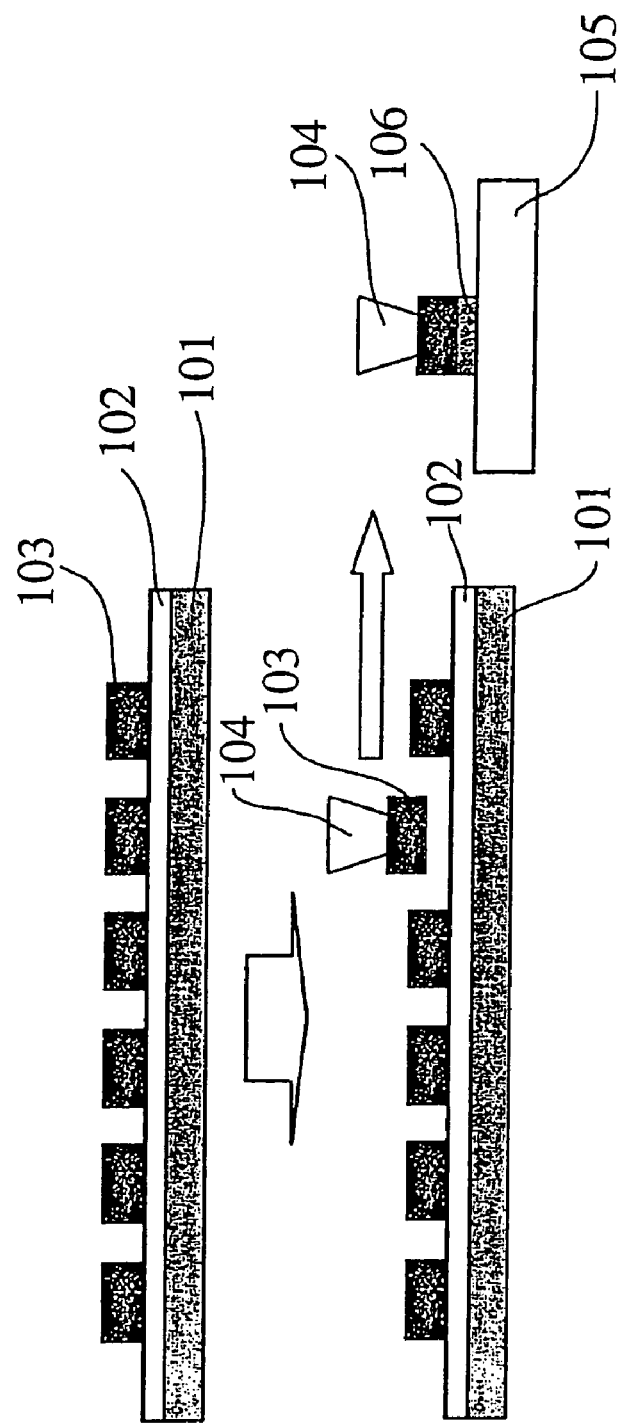

Fig.2C

DEVICE TRANSFERRING METHOD

CROSS REFERENCE TO RELATED APPLICATIONS

This patent application is a continuation of U.S. application Ser. No. 10/297,872 filed on Dec. 10, 2003 which is a U.S. Pat. No. 6,872,635, the disclosure of which is herein incorporated by reference. U.S. application Ser. No. 10/297,872 is a 35 U.S.C. §371 application based on International Application PCT/JP02/03549 filed on Apr. 09, 2002. The present application claims priority to Japanese Patent Application Nos. P2001-112401 filed on Apr. 11, 2001; P2001-169857 filed on Jun. 5, 2001; P2001-194890 filed on Jun. 27, 2001; herein incorporated by reference.

BACKGROUND OF THE INVENTION

The present invention relates to a device transferring method of transferring devices such as semiconductor light emitting devices, and a device arraying method and an image display unit fabricating method for transferring finely formed devices to a wider region by using the device transferring method.

At present, an array of a number of fine devices, electronic parts, electronic devices, or electronic parts formed by burying the above devices or parts in an insulator such as a plastic material are being extensively used for electronic equipment.

The assembly of an image display unit by arraying light emitting devices in a matrix is performed in two manners. For a liquid crystal display (LCD) or a plasma display panel (PDP), the light emitting devices are directly formed on a substrate, and for a light emitting diode display (LED display), single LED packages are arrayed on a substrate. In particular, for an image display unit such as an LCD or PDP, device isolation cannot be performed, so that in general, at the beginning of the fabrication process, devices are formed in such a manner as to be spaced from each other with a pitch equivalent to a pixel pitch of the image display unit.

For an image display unit such as an LCD or PDP, device isolation cannot be performed, so that in general, at the beginning of the fabrication process, devices are formed in such a manner as to be spaced from each other with a pitch equivalent to a pixel pitch of the image display unit.

On the other hand, for an image display unit such as an LED display, LED chips are packaged by taking out LED chips after dicing, and individually connecting the LED chips to external electrodes by wire-bonding or bump-connection using flip-chip. In this case, before or after packaging, the LED chips are arrayed with a pixel pitch of the image display unit; however, such a pixel pitch is independent from an array pitch of the devices at the time of formation of the devices.

Since an LED (Light Emitting Diode) representative of a light emitting device is expensive, an image display unit using such LEDs can be fabricated at a low cost by producing a large number of LEDs from one wafer. To be more specific, the cost of an image display unit can be lowered by reducing the size of an LED chip from about 300 μm square (ordinary size) to several tens μm square, and producing an image display unit by connecting such small-sized LED chips to each other.

From this viewpoint, there have been known various techniques of transferring devices densely formed on a substrate to a wide region in such a manner that the devices are enlargedly spaced from each other in the wide region, thereby obtaining a relatively large display unit such as an image display unit. For example, U.S. Pat. No. 5,438,241 has disclosed a thin film transfer method, and Japanese Patent Laid-open No. Hei 11-142878 has disclosed a method of forming a transistor array panel for display.

In the transfer method disclosed in U.S. Pat. No. 5,438,241, devices densely formed on a substrate are coarsely re-arrayed by transferring the devices densely formed on the substrate to an extensible substrate provided with an adhesive layer, extending the extensible substrate in the X direction and the Y direction while monitoring a device array pitch and positions of respective devices, and transferring the devices on the extended substrate onto a desired display panel. In the technique disclosed in Japanese Patent Laid-open No. Hei 11-142878, thin film transistors forming a liquid crystal display portion on a first substrate are all transferred onto a second substrate, and the thin film transistors are selectively transferred from the second substrate to a third substrate in such a manner that the transferred transistors are spaced from each other on the third substrate with a pitch corresponding to a pixel pitch.

In the case of producing image display units by the above-described transfer techniques, it is required to selectively, certainly transfer only devices to be transferred, and to efficiently, accurately transfer only devices to be transferred. In general, there has been known a method of using a thermoplastic resin as an adhesive for mounting, microelectronic parts, electronic devices, or electronic parts formed by burying these electronic parts or electronic devices in an insulator such as a plastic material, on a mounting substrate. For example, necessary portions of a mounting substrate are coated with a thermoplastic resin, and electronic parts are placed on the portions of the mounting substrate; and then the entire substrate is heated, to soften the adhesive and cool it, thereby fixing the electronic parts on the substrate. Alternatively, the entire surface of the substrate is coated with a thermoplastic resin, and electronic parts are placed thereon; and then the entire substrate is heated, to soften the adhesive and cool it, thereby fixing the electronic parts on the substrate. In addition, there has been known a method of obtaining the same structure by removing the exposed adhesive by etching or plasma treatment.

In the case of using such a method, however, there arises a problem that since the electronic parts must be placed one by one, the work becomes complicated, and since the entire substrate is heated, there occurs the positional deviation and peeling of other parts. For example, in the case of arranging all of parts on the supply side on a substrate with the array pitch kept as it is, it is possible to use of transferring the parts on the supply side to the substrate. In the case of using a thermoplastic resin for this transfer, the entire substrate is heated by a high frequency heating treatment or exposed to a heating atmosphere, to allow the thermoplastic resin to exhibit an adhesive force stronger than an adhesive force of the parts against the supply side, thereby transferring the parts to the substrate side.

Parts to be transferred and parts not to be transferred can be selectively transferred by using the above transfer method; however, according to the existing technique, it is difficult to heat only the desired parts, and therefore, this method has been not put into practical use. In the case of the overall heating, if an excess portion is coated with a thermoplastic resin, the array positions of parts may be possibly changed by the flow of the thermoplastic resin. Accordingly, in general, it is required to coat portions, at which parts are to be placed, of the substrate with a resin, and therefore, it fails to solve the above-described problem associated with the complicated work. Similarly, there may be considered a method of picking up electronic parts once from a supply source by using an attracting head and placing them on a substrate; however, in this method, if the entire substrate is heated in the case of fixedly transferring the electronic parts from the attracting head to the substrate, there may occur an inconvenience that other parts having been already fixed to the substrate be peeled therefrom.

In the case of performing overall heating by laser irradiation, if either of a thermoplastic resin and each part has a low light absorptivity against laser beams, there occurs a problem that the thermoplastic resin is not heated to a desired temperature. Also, if the parts are taken as heating planes, the parts are required to have a high heat-resistance. Further, in the case of performing overall heating by laser irradiation, it is required to select such a wavelength of laser beams that at least one of a thermoplastic resin, each part, and wiring on the substrate has a high light absorptivity against the laser beams.

For example, there has been known a device transferring method shown in FIGS. 1(a) and 1(b), wherein devices 103 are arrayed on an adhesive layer 102 on a base substrate 101 as shown in FIG. 1(a), and are picked up by using an attracting head 104 as shown in FIG. 1(b), to be transferred to an adhesive layer 106 on another substrate 105.

This method, however, has problems that since a plurality of steps of picking up each device by the attracting head, moving the attracting head, and placing the device to the substrate are required to transfer the devices, the transfer process becomes complicated, and since a plurality of kinds of equipment are required to be provided, the cost is raised, and that since the devices must be picked up one by one for mounting the devices, the mounting work becomes very complicated, and it takes much time to transfer the devices. If it is intended to improve the working efficiency of the mounting machine for shortening the time required to mount the devices, there occurs another problem that the accuracy of arraying of the device at the time of mounting the devices is degraded. Additionally, in the case of using the existing mounting machine, the positioning accuracy at the time of arraying devices has a limitation to about 10 µm, and therefore, it is difficult to further enhance the positioning accuracy by the existing positioning method.

SUMMARY OF THE INVENTION

The present invention provides a device transferring method capable of transferring with certainty only those devices to be transferred of devices on a substrate, thereby efficiently and accurately transferring the devices, and provides a device arraying method and an image display unit fabricating method using the device transferring method.

According to an embodiment of the present invention, there is provided a device transferring method of selectively transferring devices arrayed on a first substrate to a second substrate on which an adhesive resin layer is previously formed, the method including:

a heating step of selectively heating the adhesive resin layer on the second substrate by laser irradiation from the back surface side of the second substrate; and a curing step of curing the selectively heated portions of the adhesive resin layer, thereby adhesively bonding those to be transferred of the devices to the second substrate.

With this device transferring method, portions, corresponding to devices to be transferred, of the adhesive resin layer are heated directly or indirectly via the devices or wiring by laser irradiation from the back surface side of the substrate. The heated portions of the adhesive resin layer are allowed to selectively exhibit adhesive forces. By curing these portions of the adhesive resin layer, only the devices to be transferred can be selectively transferred to the second substrate without peeling and positional deviation of other parts. In this case, it is not required to selectively form the adhesive resin layer by coating.

According to the present invention, there is provided a device arraying method of re-arraying a plurality of devices arrayed on a first substrate to a second substrate, the method including:

a first transferring step of transferring the devices from the first substrate to a temporarily holding member in such a manner that the devices are spaced from each other with a pitch larger than a pitch of the devices arrayed on the first substrate and holding the devices on the temporarily holding member;

a covering step of covering the devices held on the temporarily holding member with a resin;

a dicing step of dicing the resin so as to isolate the devices from each other;

a second transferring step of transferring the resin-covered devices held on the temporarily holding member to the second substrate in such a manner that the resin-covered devices are spaced from each other with a pitch larger than a pitch of the resin-covered devices held on the temporarily holding member;

wherein the second transferring step includes the steps of selectively heating an adhesive resin layer on the second substrate by laser irradiation from the back surface side of the second substrate, and curing the selectively heated portions of the adhesive resin layer, thereby adhesively bonding those to be transferred of the resin-covered devices to the second substrate.

With this device arraying method, since the devices can be efficiently and performed with certainty and accuracy, it is possible to smoothly perform enlarged transfer by means of which the devices are transferred in such a manner as to be spaced from each other with an enlarged pitch.

According to an embodiment of the present invention, there is provided an image display unit fabricating method of fabricating an image display unit including light emitting devices disposed in a matrix, the method including:

a first transferring step of transferring the light emitting devices from the first substrate to a temporarily holding member in such a manner that the light emitting devices are spaced from each other with a pitch larger than a pitch of the light emitting devices arrayed on the first substrate and holding the light emitting devices on the temporarily holding member;

a covering step of covering the light emitting devices held on the temporarily holding member with a resin;

a dicing step of dicing the resin so as to isolate the light emitting devices from each other;

a second transferring step of transferring the resin-covered devices held on the temporarily holding member to the second substrate in such a manner that the resin-covered devices are spaced from each other with a pitch larger than a pitch of the resin-covered devices held on the temporarily holding member;

herein the second transferring step includes the steps of selectively heating an adhesive resin layer on the second substrate by laser irradiation from the back surface side of the second substrate, and curing the selectively heated portions of the adhesive resin layer, thereby adhesively bonding those to be transferred of the resin-covered devices to the second substrate.

With this image display unit fabricating method, the light emitting devices are arrayed in a matrix by making use of the above-described device transferring method and the device arraying method, to form an image display portion. Accordingly, it is possible to efficiently re-array the light emitting devices, which have been formed on the first substrate densely, that is, with a high degree of integration, on the second substrate in such a manner as to be spaced from each other with an enlarged pitch, and hence to significantly improve the productivity.

According to an embodiment of the present invention, there is provided another device transferring method of transferring devices arrayed on a first substrate to a second substrate on which an adhesive layer is previously formed, the method including:

a heating step of selectively heating the adhesive layer on the second substrate by irradiating those to be transferred of the devices with laser beams passing through the second substrate, thereby adhesively bonding the devices to be transferred to the second substrate;

wherein a light absorbing material for increasing a light absorptivity of the adhesive layer against the laser beams is contained in the adhesive layer or disposed in the vicinity of the adhesive layer.

With this device transferring method, portions, corresponding to devices to be transferred, of the adhesive layer can be selectively heated, by laser irradiation from the back surface side of the substrate, directly or indirectly via the devices or wiring without heating portions, near devices other than the devices to be transferred, of the adhesive layer. Also, since the light absorbing material for increasing the light absorptivity of the adhesive layer against laser beams is contained in the adhesive layer or disposed in the vicinity of the adhesive layer, portions, corresponding to devices to be transferred, of the adhesive layer are allowed to more desirably absorb the laser beams, and hence to be more desirably heated. As a result, it is possible to efficiently, selectively heat the portions, corresponding to the devices to be transferred, of the adhesive layer.

Since the laser beams are absorbed by the light absorbing material having the light absorptivity against the laser beams, the laser beams do not reach the devices to be transferred, so that it is possible to prevent the devices to be transferred from being damaged by the laser beams. As a result, it is possible to select any kind and wavelength of the laser beam irrespective of the material of the device, that is, with the damage of the device by the laser beam not taken into account.

By selecting a material having a known laser beam absorption characteristic as the light absorbing material for increasing the light absorptivity of the adhesive layer against laser beams to be contained in the adhesive layer or disposed in the vicinity of the adhesive layer, it is possible to estimate the heat generation amount of the light absorbing material upon heating, and hence to select a material being independent of the laser beam absorption characteristic as the material of the device.

According to an embodiment of the present invention, there is provided another device arraying method of re-arraying a plurality of devices arrayed on a first substrate to a second substrate, the method including:

a first transferring step of transferring the devices from the first substrate to a temporarily holding member in such a manner that the devices are spaced from each other with a pitch larger than a pitch of the devices arrayed on the first substrate and holding the devices on the temporarily holding member;

a device isolation step of covering the devices held on the temporarily holding member with a resin and isolating the devices covered with the resin from each other;

an adhesive layer forming step of forming an adhesive layer containing a light absorbing material for increasing a light absorptivity against laser beams on the second substrate or disposing the light absorbing material in the vicinity of the adhesive layer; and a second transferring step of selectively heating the adhesive layer on the second substrate by irradiating those to be transferred of the devices with laser beams passing through the second substrate, thereby transferring those to be transferred of the devices covered with the resin on the temporarily holding substrate to the second substrate.

With this device arraying method, since portions, near the devices to be transferred, of the adhesive layer can be efficiently, certainly heated by using the above-described device transferring method, it is possible to efficiently and with certainty perform the transfer of the desired devices and hence to smoothly perform enlarged transfer by means of which the desired devices are transferred in such a manner as to be spaced from each other with an enlarged pitch.

According to an embodiment of the present invention, there is provided another image display unit fabricating method of fabricating an image display unit including light emitting devices disposed in a matrix, the method including:

a first transferring step of transferring the light emitting devices from the first substrate to a temporarily holding member in such a manner that the light emitting devices are spaced from each other with a pitch larger than a pitch of the light emitting devices arrayed on the first substrate and holding the light emitting devices on the temporarily holding member;

a device isolation step of covering the light emitting devices held on the temporarily holding member with a resin and isolating the light emitting devices covered with the resin from each other;

an adhesive layer forming step of forming an adhesive layer containing a light absorbing material for increasing a light absorptivity against laser beams on the second substrate or disposing the light absorbing material in the vicinity of the adhesive layer; and a second transferring step of selectively heating the adhesive layer on the second substrate by irradiating those to be transferred of the light emitting devices with laser beams passing through the second substrate, thereby transferring those to be transferred of the light emitting devices covered with the resin on the temporarily holding substrate to the second substrate.

With this image display unit fabricating method, the light emitting devices are arrayed in a matrix by making use of the above-described device transferring method and the device arraying method, to form an image display portion. Accordingly, since portions, near the devices to be transferred, of the adhesive layer can be efficiently, certainly heated, it is possible to efficiently and with certainty perform the transfer of the devices. This makes it is possible to efficiently re-array the light emitting devices, which have been formed on the first substrate densely, that is, with a high degree of integration, on the second substrate in such a manner as to be spaced from each other with an enlarged pitch, and hence to significantly improve the productivity.

According to an embodiment of the present invention, there is provided a further device transferring method including:

a superimposing step of superimposing a second substrate having a thermoplastic adhesive layer on a first substrate on which devices are previously fixed in array via a thermal re-peelable layer; and a heating/cooling step of heating and cooling, in a state that the devices are in contact with the thermoplastic adhesive layer, the thermal re-peelable layer and the thermoplastic adhesive layer, to make the devices peelable from the thermal re-peelable layer and simultaneously melt and cure the thermoplastic adhesive layer, thereby transferring the devices to the second substrate.

With this device transferring method, the second substrate having the thermoplastic adhesive layer is superimposed on the first substrate on which devices are previously fixed in array via the thermal re-peelable layer, and in a state that the devices are in contact with the thermoplastic adhesive layer, the thermal re-peelable layer and the thermoplastic adhesive layer are heated and cooled, to transfer the devices from the first substrate to the second substrate.

Accordingly, in this device transferring method, the peeling of the devices from the first substrate and the adhesive bonding of the devices to the second substrate can be substantially simultaneously performed only by the heating process.

According to an embodiment of the present invention, there is provided a further device arraying method of re-arraying a plurality of devices arrayed on a first substrate to a second substrate, the method including:

a first transferring step of transferring the devices from the first substrate to a temporarily holding member in such a manner that the devices are spaced from each other with a pitch larger than a pitch of the devices arrayed on the first substrate and holding the devices on the temporarily holding member;

a covering step of covering the devices held on the temporarily holding member with a resin;

a dicing step of dicing the resin so as to isolate the devices from each other;

a second transferring step of transferring the resin-covered devices held on the temporarily holding member to the second substrate in such a manner that the resin-covered devices are spaced from each other with a pitch larger than a pitch of the resin-covered devices held on the temporarily holding member;

wherein the second transferring step includes:

a fixing step of fixing the resin-covered devices on a second temporarily holding member via a thermal re-peelable layer;

a superimposing step of superimposing the second substrate having a thermoplastic adhesive layer on the second temporarily holding member; and a heating/cooling step of heating and cooling, in a state that the resin-covered devices are in contact with the thermoplastic adhesive layer, the thermal re-peelable layer and the thermoplastic adhesive layer, to make the resin-covered devices peelable from the thermal re-peelable layer and simultaneously melt and cure the thermoplastic adhesive layer, thereby transferring the resin-covered devices to the second substrate.

With this device arraying method, since the devices can be efficiently and with certainty performed by using the above-described device transferring method, it is possible to smoothly perform enlarged transfer by means of which the desired devices are transferred in such a manner as to be spaced from each other with an enlarged pitch.

According to an embodiment of the present invention, there is provided a further image display unit fabricating method of fabricating an image display unit including light emitting devices disposed in a matrix, the method including:

a first transferring step of transferring the light emitting devices from the first substrate to a temporarily holding member in such a manner that the light emitting devices are spaced from each other with a pitch larger than a pitch of the light emitting devices arrayed on the first substrate and holding the light emitting devices on the temporarily holding member;

a covering step of covering the light emitting devices held on the temporarily holding member with a resin;

a dicing step of dicing the resin so as to isolate the light emitting devices from each other;

a second transferring step of transferring the resin-covered devices held on the temporarily holding member to the second substrate in such a manner that the resin-covered devices are spaced from each other with a pitch larger than a pitch of the resin-covered devices held on the temporarily holding member;

wherein the second transferring step includes:

a fixing step of fixing the resin-covered devices on a second temporarily holding member via a thermal re-peelable layer;

a superimposing step of superimposing the second substrate having a thermoplastic adhesive layer on the second temporarily holding member; and a heating/cooling step of heating and cooling, in a state that the resin-covered devices are in contact with the thermoplastic adhesive layer, the thermal re-peelable layer and the thermoplastic adhesive layer, to make the resin-covered devices peelable from the thermal re-peelable layer and simultaneously melt and cure the thermoplastic adhesive layer, thereby transferring the resin-covered devices to the second substrate.

With this image display unit fabricating method, the light emitting devices are arrayed in a matrix by making use of the above-described device transferring method and the device arraying method, to form an image display portion. Accordingly, since portions, near the devices to be transferred, of the adhesive layer can be efficiently, certainly heated, it is possible to efficiently, certainly perform the transfer of the devices. This makes it is possible to efficiently re-array the light emitting devices, which have been formed on the first substrate densely, that is, with a high degree of integration, on the second substrate in such a manner as to be spaced from each other with an enlarged pitch, and hence to significantly improve the productivity.

Additional features and advantages of the present invention are described in, and will be apparent from, the following Detailed Description of the Invention and the figures.

BRIEF DESCRIPTION OF THE FIGURES

FIGS. 1(a) and 1(b) are schematic sectional views showing a related art device transferring method.

FIG. 2(c) is a schematic view showing a state after the temporarily holding member is peeled from the base substrate according to an embodiment of the present invention.

FIGS. 6(a) to 6(d) are schematic views showing a device arraying method according to an embodiment of the present invention, wherein FIG. 6(a) shows a state that devices such as light emitting devices are densely formed on a first substrate, FIG. 6(b) shows a state that the devices are transferred from the first substrate to a temporarily holding member shown by broken lines, FIG. 6(c) shows a state that the devices held on the temporarily holding member are spaced from each other, and FIG. 6(d) shows a state that the devices in the form of resin-covered chips are transferred to a second substrate in such a manner as to be enlargedly spaced from each other.

FIGS. 18(a) to 18(c) are schematic sectional views showing one example of a transfer process according to an embodiment of the present invention, wherein FIG. 18(a) shows a state that the thermal re-peelable layer is formed on a base substrate and a plurality of devices are formed in array on the base substrate via the thermal re-peelable layer, FIG. 18(b) shows a state that a transfer substrate is disposed in a specific positional relationship with the base substrate and is brought into press-contact therewith, and FIG. 18(c) shows a state after the transfer substrate is peeled from the base substrate.

FIGS. 22(a) to 22(c) are sectional views showing one example of a process of transferring devices of one kind to a substrate, on which devices of another kind have been mounted, in accordance with an embodiment of the present invention, wherein FIG. 22(a) shows a state that the devices are mounted on a thermoplastic adhesive layer in such a manner as to be spaced from each other at a specific pitch, FIG. 22(b) shows a state that a transfer substrate is disposed in a specific positional relationship with a base substrate and is brought into press-contact therewith, and FIG. 22(c) shows a state after the transfer substrate is peeled from the base substrate.

DETAILED DESCRIPTION OF THE INVENTION

The present invention generally relates to a device transferring methods, device arraying methods and image display unit fabricating methods. More specifically, the present invention relates to device transferring methods of transferring devices, such as semiconductor light emitting devices, and device arraying methods and image display unit fabricating methods for transferring finely formed devices to a wider region by using the device transferring method.

Figure 2A:
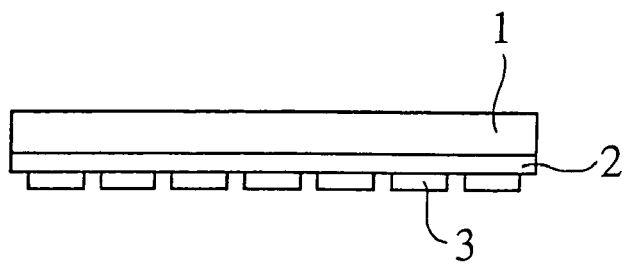
FIG. 2(a) is a schematic view showing a state that an adhesive layer is formed on a base substrate and devices 3 are formed in array on the base substrate via the adhesive layer according to an embodiment of the present invention.

In an embodiment, the present invention provides device transferring method, As shown in FIG. 2(a), an adhesive layer 2 is formed on a base substrate 1 as a supply source, and a plurality of devices 3 are formed in array on the adhesive layer 2.

The devices 3 formed on the adhesive layer 2 can be simply transferred to another substrate by using a sticky resin having a relatively small sticky or adhesive force as an adhesive of the adhesive layer 2.

As the device 3, there can be used any type of device, examples of which include a light emitting device, a liquid crystal control device, a photoelectric transfer device, a piezoelectric device, a thin film transistor device, a thin film diode device, a resistance device, a switching device, a micro-magnetic device, and a micro-optical device.

Figure 2B:
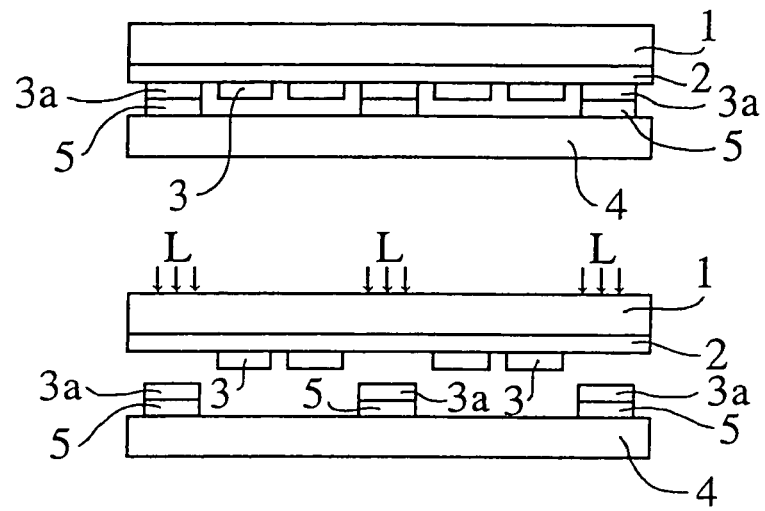
FIG. 2(b) is a schematic view showing a state that a temporarily holding member is disposed opposite to the base substrate and is brought into press-contact therewith, and only necessary devices are transferred to the temporarily holding member according to an embodiment of the present invention.

As shown in FIG. 2(b), a temporarily holding substrate (first substrate) 4, which is taken as intermediate means of transfer, is placed opposite to the base substrate 1 and is brought into press-contact therewith, to transfer only desired devices 3a from the base substrate 1 to the temporarily holding substrate 4.

An adhesive layer is previously formed on the temporarily holding substrate 4 such that adhesive layer portions 5 are selectively located at positions corresponding to those of the devices 3a to be transferred. By making the sticky force of the adhesive layer portions 5 larger than that of the adhesive layer 2 on the base substrate 1, the devices 3a can be simply transferred to the temporarily holding substrate 4. FIG. 2(c) shows a state that the temporarily holding substrate 4 has been peeled from the base substrate 1, wherein the devices 3a are left as transferred on the adhesive layer portions 5 selectively formed on the temporarily holding substrate 4.

Figure 2D:
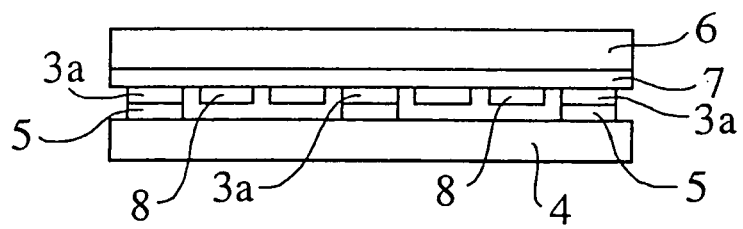
FIG. 2(d) is a schematic view showing a state that the temporarily holding member on which the devices have been transferred is disposed opposite to a transfer substrate and is brought into press-contact therewith, and the devices are transferred to the transfer substrate according to an embodiment of the present invention.

As shown in FIG. 2(d), the temporarily holding substrate 4 to which the devices 3a have been thus transferred is placed opposite to a transfer substrate (second substrate) 6 and is brought into press-contact therewith, to transfer the devices 3a to the transfer substrate 6 side. It is to be noted that an adhesive layer 7 is previously formed on the overall surface of the transfer substrate 6, wherein other parts 8 are already fixed to the adhesive layer 7. The adhesive layer 7 is formed by coating the surface of the transfer substrate 6 with, for example, a thermoplastic adhesive resin. At the time of transfer of the devices 3a, it is required to partially irradiate the adhesive layer 7 with laser beams from the back surface side of the transfer substrate 6. Accordingly, the transfer substrate 6 preferably has a light transmissivity.

The transfer of the devices 3a to the transfer substrate 6 will be more fully described below. After the temporarily holding substrate 4 is superimposed to the transfer substrate 6, the adhesive layer 7 is partially irradiated with laser beams L from the back surface side of the transfer substrate 6, to selectively soften the adhesively layer 7, and then the selectively softened adhesive layer 7 is cooled to be thus cured, whereby the devices 3 are fixed to the adhesive layer 7.

Figure 3:
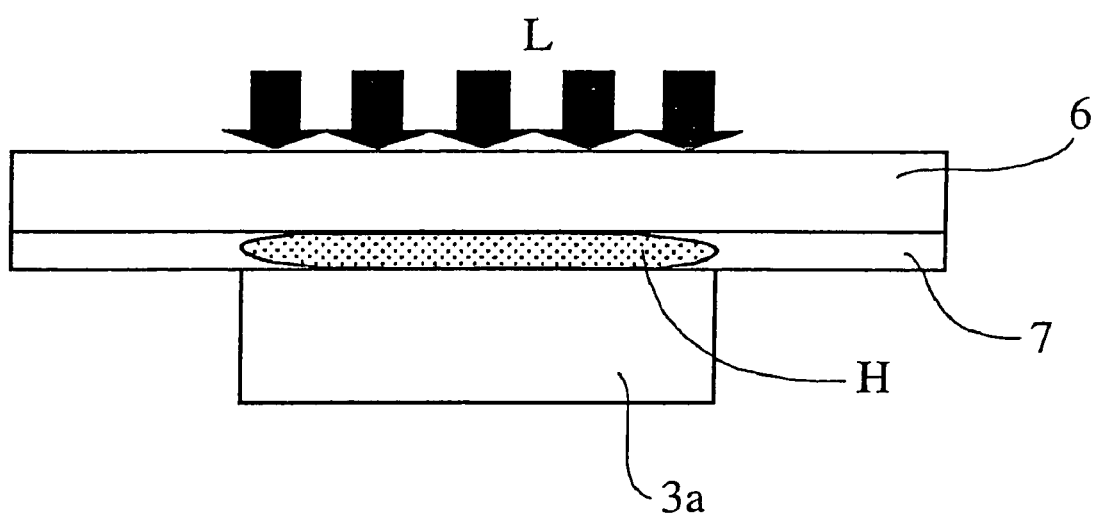
FIG. 3 is a schematic view showing a state that an adhesive resin layer is heated by laser beams according to an embodiment of the present invention.

For example, as shown in FIG. 3, only a portion, being in contact with the device 3a to be transferred, of the adhesive layer 7 is selectively irradiated with the laser beams L from the back surface side of the transfer substrate 6, to be heated. As a result, only the heated region H of the adhesive layer 7 made from a thermoplastic adhesive resin is softened, to exhibit an adhesive force against the device 3a. The irradiation of the laser beams is then stopped, and the heated region H is cooled to be cured, to fix the device 3a to the transfer substrate 6 via the adhesive layer 7.

At this time, portions, to which the other parts 8 have been adhesively bonded, of the adhesive layer 7 are not irradiated with the laser beams, and thereby these portions of the adhesive layer 7 are not softened, with a result that only the desired devices 3a can be transferred without occurrence of peeling or positional deviation of the parts 8.

Figure 4:
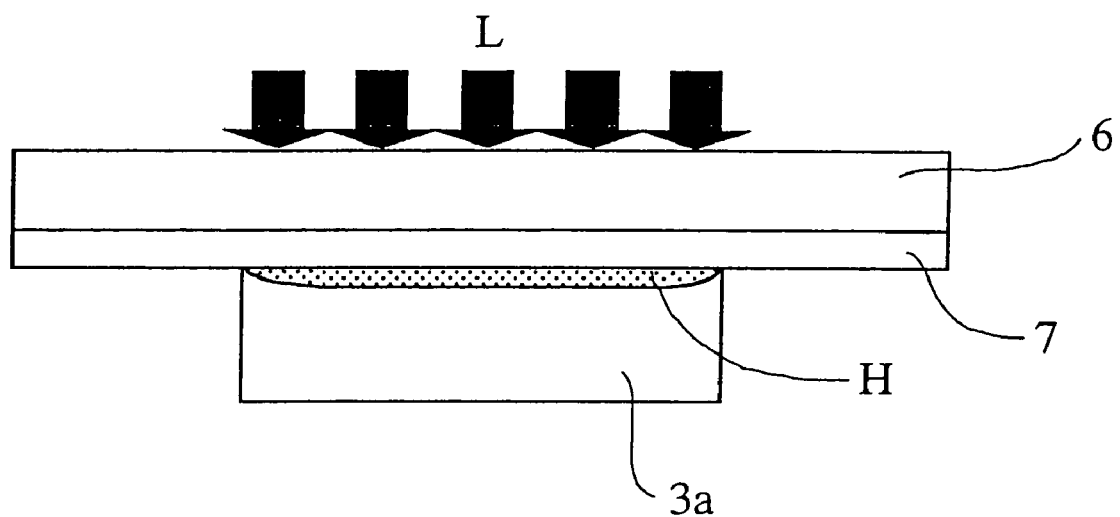
FIG. 4 is a schematic view showing a state that the device is heated by laser beams according to an embodiment of the present invention.

In this embodiment, the heating of the adhesive layer 7 is performed by directly irradiating the adhesive layer 7 with the laser beams L; however, if the adhesive layer 7 less absorbs the laser beams L, that is, if most of the laser beams L pass through the adhesive layer 7, thereby failing to directly heat the adhesive layer 7 with the laser beams L, the device 3a to be transferred may be irradiated, as shown in FIG. 4, with the laser beams L having passed through the adhesive layer 7, to heat the device 3, thereby indirectly heating the adhesive layer 7.

When the device 3a to be transferred is irradiated with the laser beams L and thereby a portion H, being in contact with the adhesive layer 7, of the device 3a is heated, the heat is transmitted to a portion, corresponding to the device 3a, of the adhesive layer 7, with a result that the portion, corresponding to the device 3a, of the adhesive layer 7 is softened. The softened portion of the adhesive layer 7 is then cooled to be cured, whereby the device 3a is fixed to the transfer substrate 6 via the adhesive layer 7.

In the case where a wiring portion is formed on the transfer substrate 6, the wiring portion may be heated by laser irradiation, to indirectly heat the adhesive layer 7.

Figure 5:
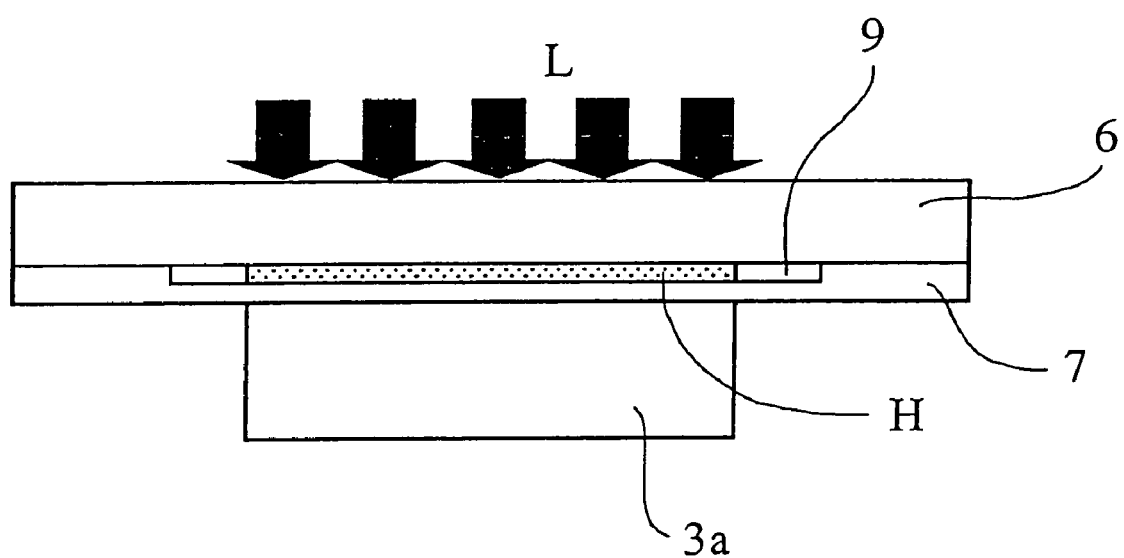
FIG. 5 is a schematic view showing a state that a wiring pattern is heated by laser beams according to an embodiment of the present invention.

FIG. 5 shows an example that a wiring pattern 9 is formed on the transfer substrate 6 and the device 3a is transferred on the wiring pattern 9. In general, the wiring pattern 9 for connecting the device 3a to a circuit is formed at a position corresponding to that of the wiring pattern 9. The wiring pattern 9 is made from a metal such as copper or aluminum, and therefore, it can be easily heated by the laser beams L.

Figure 6:
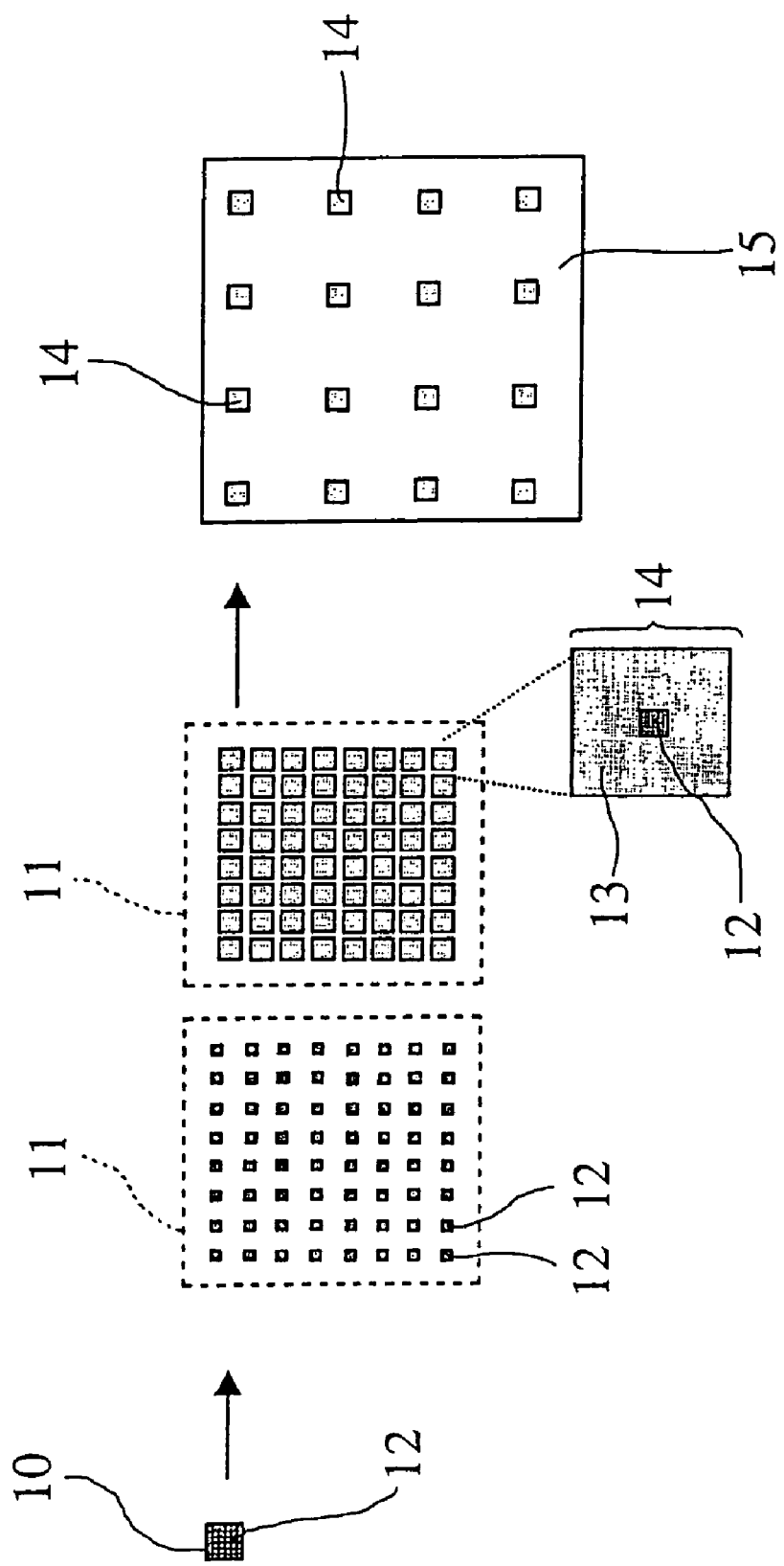

As shown in FIG. 6, the wiring pattern 9 provided at a position corresponding to that of the device 3a is irradiated with the laser beams L, and thereby a region H, corresponding to the device 3a, of the wiring pattern 9 is heated. The heat of the region H is transferred to a portion, corresponding to the device 3a, of the adhesive layer 7, to soften the portion, corresponding to the device 3a, of the adhesive layer 7. The softened portion of the adhesive layer 7 is then cooled to be cured, whereby the device 3a is fixed to the transfer substrate 6 via the adhesive layer 7.

The heating manners shown in FIGS. 3, 4 and 5 may be performed singly or in combination. In the case of adopting the combination of the heating manners shown in FIGS. 3, 4 and 5, the portion, corresponding to the device 3a, of the adhesive layer 7 is heated and softened by combining direct laser irradiation of the adhesive layer 7 with indirect laser irradiation of each of the device 3a and the wiring pattern 9.

After the devices 3a are fixed to the transfer substrate 6 via the adhesive layer 7 by selective heating due to laser irradiation, softening, and curing due to cooling, the temporarily holding substrate 4 is peeled from the transfer substrate 6.

The devices 3a to be transferred are thus transferred to the transfer substrate 6. In this state, however, the adhesive layer 7 is left as being formed on the overall surface of the transfer substrate 6.

Figure 2E:
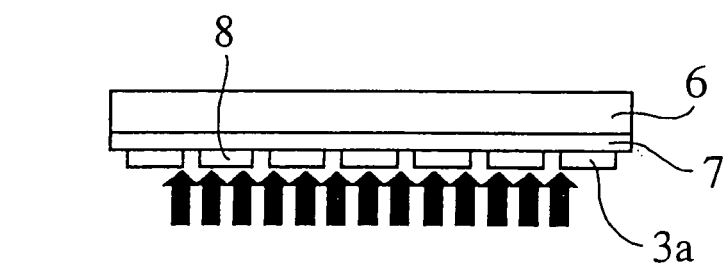
FIG. 2(e) is a schematic view showing a state that excess portions of an adhesive layer are removed by etching, to accomplish the selective transfer process according to an embodiment of the present invention.
Figure 2F:
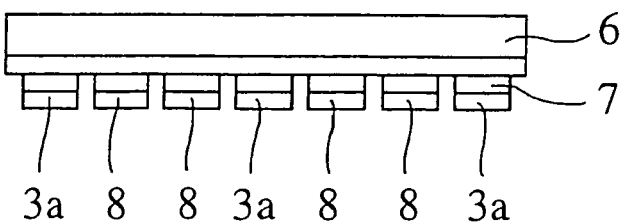
FIG. 2(f) is a schematic view showing a state of the transfer substrate to which the devices have been selectively transferred in such a manner as to be located among parts according to an embodiment of the present invention.

As shown in FIG. 2(e), unnecessary portions of the adhesive layer 7 are removed by etching, to accomplish the selective transfer process. Consequently, the transfer substrate 6, to which the devices 3a have been selectively transferred so as to be located among the parts 8 as shown in FIG. 2(f), can be obtained.

As described above, very narrow portions of the adhesive layer 7 can be heated for a short time by using laser beams. To be more specific, only the portion, corresponding to the devices 3a, of the adhesive layer 7 can be selectively heated without transfer of the heat to the adjacent portions, to which the parts 8 have been adhesively bonded, of the adhesive layer 7. As a result, the devices 3a can be selectively transferred without exerting any thermal effect on the fixed states of the parts 8 left as adhesively bonded adjacent to the devices 3a.

If the adhesive layer 7 is overall heated as having been carried out by the related art method, there may occur an inconvenience that the portions, to which the other parts 8 have been fixed, of the adhesively layer 7 be heated and fluidized, thereby tending to displace the parts 8. Such an inconvenience can be solved by the present invention. Another advantage of the present invention is as follows: namely, in the forming the adhesive layer 7, it is not required to selectively coat only the portions, corresponding to the devices 3a, of the transfer substrate 6 with a small amount of the adhesive, but it is sufficient to coat the overall surface of the transfer substrate 6 with the adhesive, and consequently, it is possible to simplify the selective transfer process.

In an embodiment, the adhesive layer 7 is made from a thermoplastic adhesive resin; however, the adhesive layer 7 may be made from a thermosetting adhesive resin. In the case of using the adhesive layer 7 made from a thermosetting adhesive resin, only portions, corresponding to the devices 3a, of the adhesive layer 7 may be heated by laser irradiation, to be thermally cured, thereby fixing the devices 3a to the transfer substrate 6 via the adhesive layer 7.

It is very useful to apply the above-described transfer method to transfer of devices in fabrication of an active matrix type image display unit. In an active matrix type image display unit, light emitting devices of R, G, and B must be disposed adjacent to an Si transistor as a drive device by sequentially transferring the light emitting devices of R, G, and B to positions close to the Si transistor. In this transfer, however, since the Si transistor has a very high thermal conductivity, if heat is applied thereto, an inner circuit thereof may be broken. Such an inconvenience can be solved by the above-described transfer method. That is to say, according to this transfer method, the transfer of heat to the Si transistor can be avoided during the step of transferring the light emitting devices of R, G, and B.

Assuming that the Si transistor has a size of 560 µm×160 µm×35 µm, each of the light emitting devices has a small area (one side: about 5 to 10 µm), an epoxy based thermosetting resin is used as an adhesive resin of an adhesive layer, and a YAG second harmonic laser (wavelength: 532 nm) is used as a laser source, it takes 1 nsec to heat portions, corresponding to the light emitting devices, of the adhesive layer by laser irradiation and it takes about 10 nsec to cool the heated portions of the adhesive layer. As long as it takes 4 nsec or less to heat the portions, corresponding to the light emitting devices, of the adhesive layer by laser irradiation, the Si transistor adjacent thereto is not affected by the heat generated by laser irradiation.

As an application example of the above-described transfer method, a device arraying method and an image display unit fabricating method based on a two-step enlarged transfer method will be described below according to an embodiment of the present invention. The two-step enlarged transfer method applied to the device arraying method and the image display unit fabricating method is carried out by forming devices on a first substrate at a high density, transferring the devices to a temporarily holding member in such a manner that the devices are spaced from each other with a pitch larger than a pitch of the devices arrayed on the first substrate, and transferring the devices held on the temporarily holding member to a second substrate in such a manner that the devices are spaced from each other with a pitch larger than the pitch of the devices held on the temporarily holding member. Although two-step transfer is adopted in this embodiment, multi-step transfer such as three or more-step transfer can be adopted depending on a required enlargement ratio between the pitch of the devices arrayed on the first substrate and the pitch of the devices mounted on the second substrate.

FIGS. 6(*a*) to 6(*d*) show basic steps of the two-step enlarged transfer method.

As shown in FIG. 6(*a*), devices 12 such as light emitting devices are densely formed on a first substrate 10. By densely forming devices on a substrate, the number of devices formed per each substrate can be increased, to reduce a final product cost thereof. The first substrate 10 may be selected from substrates on each of which devices can be formed, for example, a semiconductor wafer, a glass substrate, a quartz glass substrate, a sapphire substrate, and a plastic substrate. The devices 12 may be directly formed on the first substrate 10, or may be formed once on another substrate, and then transferred to the first substrate 10.

As shown in FIG. 6(*b*), the devices 12 are transferred from the first substrate 10 to a temporarily holding member 11 shown by broken lines in the figure, and held on the temporarily holding member 11. On the temporarily holding member 11, the adjacent two of the devices 12 are enlargedly spaced from each other, and the devices 12 are arrayed in a matrix as a whole (see FIG. 6(*b*)). Specifically, the devices 12 are transferred onto the temporarily holding member 11 in such a manner as to be enlargedly spaced from each other not only in the X direction but also in the Y direction perpendicular to the X direction. The enlarged distance between the adjacent two of the devices 12 on the temporarily holding member 11 is not particularly limited, but may be determined, for example, in consideration of formation of resin portions and formation of electrode pads in the subsequent steps. The devices 12 on the first substrate 10 can be all transferred from the first substrate 10 to the temporarily holding member 11 in such a manner as to be enlargedly spaced from each other. In this case, a size of the temporarily holding member 11 in each of the X direction and the Y direction may be equal to or more than a value obtained by multiplying the enlarged distance by the number of those, arrayed in each of the X direction and the Y direction, of the devices 12 arrayed in the matrix on the temporarily holding member 11. In addition, part of the devices 12 on the first substrate 10 may be transferred to the temporarily holding member 11 in such a manner as to be enlargedly spaced from each other.

After such a first transferring step, as shown in FIG. 6(*c*), each of the devices 12 enlargedly spaced from each other on the temporarily holding member 11 is covered with a resin, and electrode pads are formed on the resin portion covering the device 11. The reason why each device 11 is covered with the resin is to facilitate the formation of the electrode pads and to facilitate the handling of the device 11 in the subsequent second transferring step. To prevent occurrence of a wiring failure in a final wiring step performed after the second transferring step (which will be described later), the electrode pads are formed into relatively large sizes. It is to be noted that the electrode pads are not shown in FIG. 6(*c*). A resin-covered chip 14 is thus formed by covering each of the devices 12 with a resin 13. The device 11 is located at an approximately central portion of the resin-covered chip 14 in a plan view in this embodiment; however, the device 11 may be located at a position offset to one side or a corner of the resin-covered chip 14.

As shown in FIG. 6(d), a second transferring step is carried out. In this second transferring step, the devices 12 arrayed in the matrix on the temporarily holding member 11 in the form of the resin-covered chips 14 are transferred to a second substrate 15 in such a manner as to be more enlargedly spaced from each other.

It is to be noted that as will be described in detail, the transfer method shown in FIGS. 2(a) to 2(f) is applied to the second transferring step.

Even in the second transferring step, adjacent two of the devices 12 in the form of the resin-covered chips 14 are more enlargedly spaced from each other as compared with the first transferring step, to be arrayed in a matrix shown in the figure. Specifically, the devices 12 are transferred in such a manner as to be more enlargedly spaced from each other as compared with the first transferring step, not only in the X direction but also in the Y direction. If positions of the devices 12 arrayed on the second substrate 15 in the second transferring step correspond to positions of pixels of a final product such as an image display unit, a pitch of the devices 12 arrayed on the second substrate 15 in the second transferring step becomes about integer times an original pitch of the devices 12 arrayed on the first substrate 10. Assuming that an enlargement ratio between the pitch of the devices 12 held on the temporarily holding member 11 and the pitch of the devices 12 arrayed on the first substrate 10 is taken as "n" and an enlargement ratio between the pitch of the devices 12 arrayed on the second substrate 15 and the pitch of the devices 12 held on the temporarily holding member 11 is taken as "m", a value E of the above-described about integer times is expressed by E=n×m. The enlargement ratios "n" and "m" may be set to integers, but they may be not integers insofar as they are selected such that the value E becomes an integer. For example, if the ratio "n" is set to 2.4 (not integer) and the ratio "m" is set to 5 (integer), the value E becomes 12 (integer).

The devices 12 in the form of the resin-covered chips 14, which are sufficiently enlargedly spaced from each other on the second substrate 15, are then subjected to wiring. The wiring is performed with care taken not to cause a connection failure by making use of the previously formed electrode pads and the like. If the devices 12 are light emitting devices such as light emitting diodes, the wiring includes wiring to p-electrodes and n-electrodes. If the devices 12 are liquid crystal control devices, the wiring includes wiring to selective signal lines, voltage lines, alignment electrode films, and the like.

In the two-step enlarged transfer shown in FIGS. 6(a) to 6(d), each device 11 is covered with the resin and electrode pads are formed on the resin portion covering the device 11 by making use of the enlarged distance between adjacent two of the devices 12 after the first transfer, and wiring can be performed after the second transfer without occurrence of any connection failure by making use of the previously formed electrode pads and the like. As a result, it is possible to improve a fabrication yield of the image display unit.

The two-step enlarged transfer method according to this embodiment includes the two enlarged transfer steps in each of which the devices are enlargedly spaced from each other. By performing a plurality of such enlarged transfer steps in each of which the devices are enlargedly spaced from each other, the number of transfer can be actually reduced. For example, assuming that an enlargement ratio between the pitch of the devices 12 on the temporarily holding member 11 (11a) and the pitch of the devices 12 on the first substrate 10 (10a) is taken as 2 (n=2) and an enlargement ratio between the pitch of the devices 12 on the second substrate 15 and the pitch of the devices 12 on the temporarily holding member 11 (11a) is taken as 2 (m=2), the total enlargement ratio becomes 2×2=4. To realize the total enlargement ratio (=4), according to a one-step transfer method, the number of transfer (alignment) of the devices 12 from the first substrate 10 to the second substrate 15 becomes 16 (=4²). On the contrary, to realize the same total enlargement ratio (=4), according to the two-step enlarged transfer method of this embodiment, the number of transfer (alignment) is obtained by simply adding a square of the enlargement ratio (=2) in the first transferring step to a square of the enlargement ratio (=2) in the second transferring step, with a result that the number of transfer becomes 8 (=4+4). Specifically, according to the two-step enlarged transfer method, to achieve the total enlargement ratio (transfer magnification) of n×m, the total number of transfer becomes $(n^2+m^2)$ times, while according to the one-step transfer method, to achieve the same total enlargement ratio (transfer magnification) of n×m, the number of transfer becomes $(n+m)^2=n^2+2nm+m^2$. As a result, according to the two-step enlarged transfer method, the number of transfer can be made smaller than that according to the one-step transfer method by 2 nm times, thereby correspondingly saving time and cost required for the fabrication step. This becomes more useful as the total enlargement ratio becomes large.

In the two-step enlarged transfer method shown in FIGS. 6(a) to 6(d), the device 12 is exemplified by a light emitting device; however, the device 12 is not limited thereto but may be selected from a liquid crystal control device, a photoelectric transfer device, a piezoelectric device, a thin film transistor device, a thin film diode device, a resistance device, a switching device, a micro-magnetic device, a micro-optical device, and a combination thereof.

Figure 7:
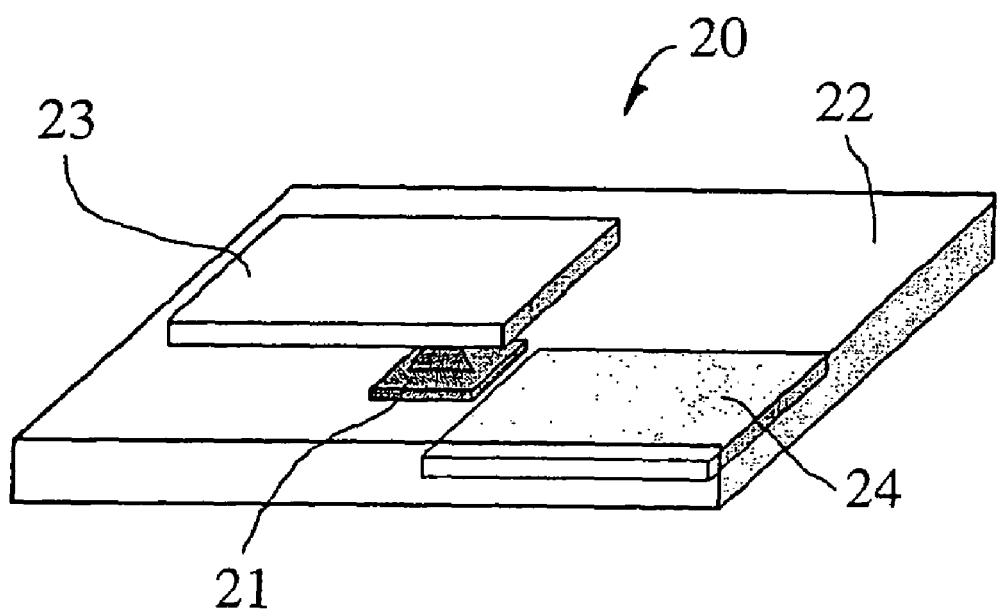
FIG. 7 is a schematic perspective view of a resin-covered chip according to an embodiment of the present invention.
Figure 8:
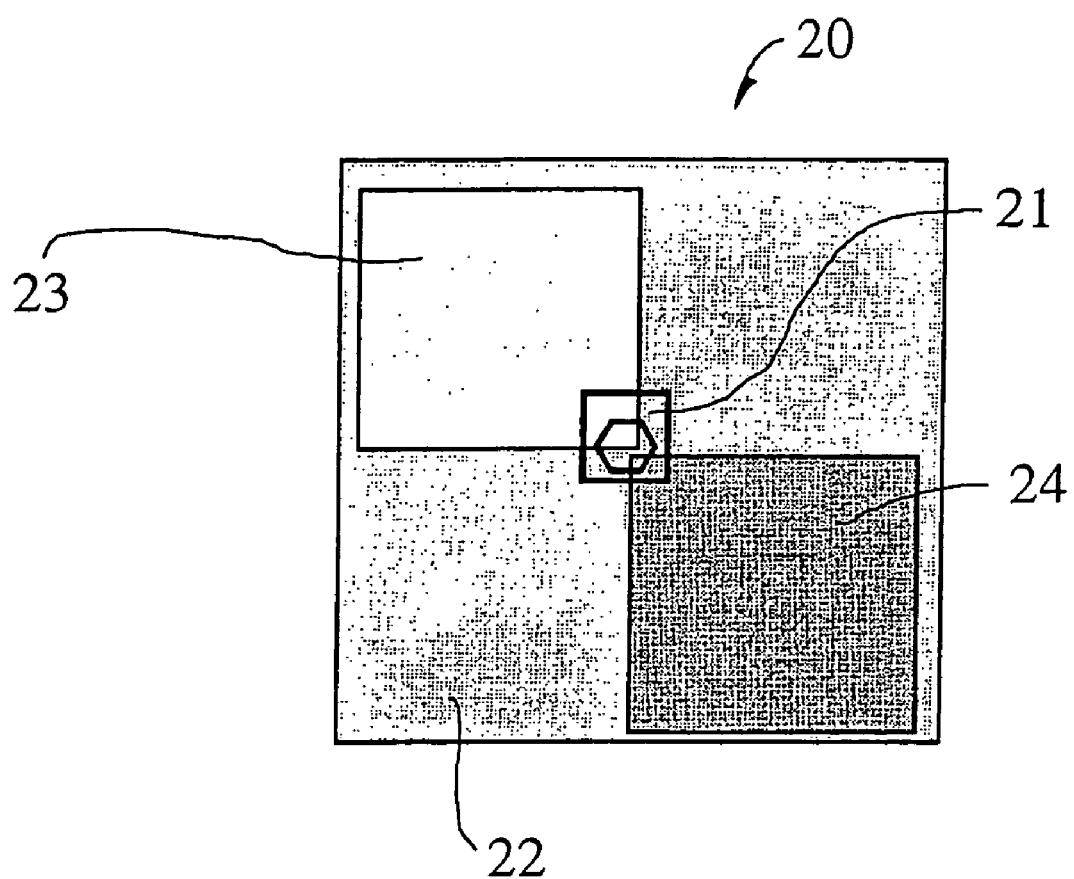
FIG. 8 is a schematic plan view of the resin-covered chip according to an embodiment of the present invention.

The device is handled as the resin-covered chip in the second transferring step, and is transferred from the temporarily holding member to the second substrate. Such a resin-covered chip will be described with reference to FIGS. 7 and 8.

A resin-covered chip 20 is formed by covering each of devices 21 spaced from each other with a resin 22. The resin-covered chip 20 is usable in transfer of the device 21 from a temporarily holding member to a second substrate as described above.

The resin-covered chip 20 is formed into an approximately flat plate shape with an approximately square shaped principal plane. The shape of the resin-covered chip 20 is equivalent to the shape of the cured resin 22 covering the light emitting device 21. To be more specific, the resin-covered chips 20 are obtained by coating the overall surface of a temporarily holding member so as to cover the devices 21 with a non-cured resin 22, curing the resin 22, and cutting edge portions of the cured resin 22 into chips by dicing.

Electrode pads 23 and 24 are formed on front and back surface sides of the approximately flat plate like resin 22, respectively. These electrode pads 23 and 24 are each produced by forming a conductive layer made from a metal or polysilicon as a material for forming each of the electrode pads 23 and 24 overall on each of the front and back surfaces of the resin 22, and patterning the conductive layer into a specific electrode shape by photolithography. These electrode pads 23 and 24 are formed so as to be connected to a p-electrode and an n-electrode of the device 21 as the light emitting device, respectively. If needed, via-holes may be formed in the resin 22.

In this embodiment, the electrode pads 23 and 24 are formed on the front and back surface sides of the resin-covered chip 20, respectively; however, they may be formed on either of the front and back surface sides of the resin-covered chip 20. If the device 21 is a thin film transistor having three electrodes, that is, source, gate, and drain electrodes, three or more electrode pads may be formed. The reason why the electrode pads 23 and 24 are offset from each other in the horizontal direction is to prevent the electrode pads 23 and 24 from being overlapped to each other even if a contact hole is formed from above upon formation of final wiring. The shape of each of the electrode pads 23 and 24 is not limited to a square shape but may be any other shape.

The formation of such a resin-covered chip 20 is advantageous in that since the device 21 is covered with the flattened resin 22, the electrode pads 23 and 24 can be accurately formed on the flattened front and back surfaces of the resin 22, and the electrode pads 23 and 24 can be formed so as to extend to a region wider than the size of the device 21, thereby facilitating the handling of the device 21 at the time of transfer by using an attracting jig in the second transferring step. As will be described later, since final wiring is performed after the second transferring step, a wiring failure can be prevented by performing wiring by making use of the electrode pads 23 and 24 having relatively large sizes.

Figure 9A:
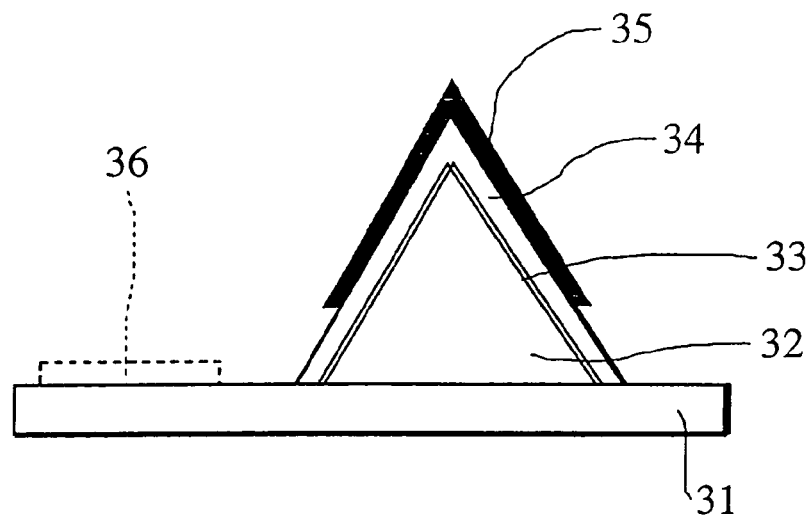
FIGS. 9(a) and 9(b) are a sectional view and a plan view showing one example of a light emitting device according to an embodiment of the present invention.
Figure 9B:
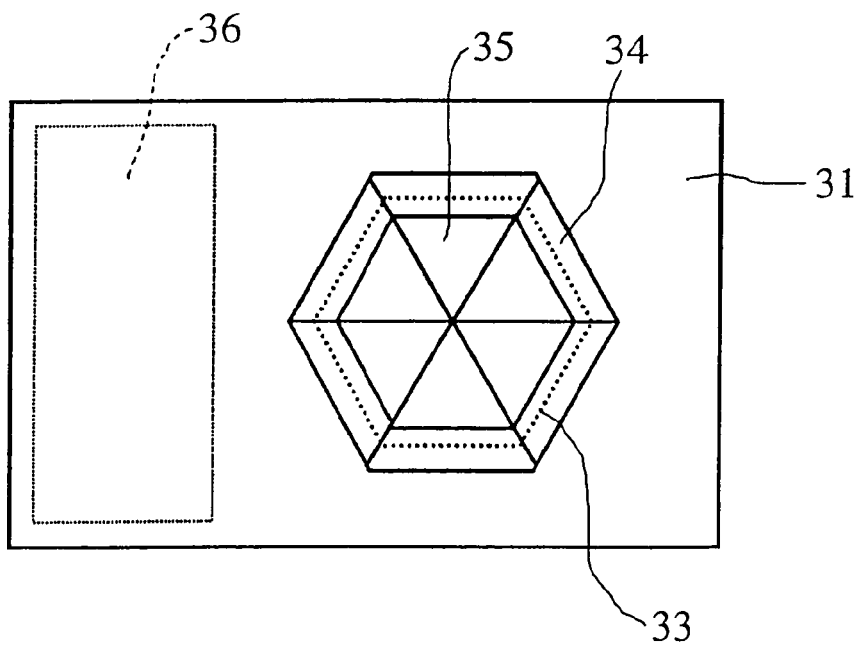

FIGS. 9(a) and 9(b) are a sectional view and a plan view, showing a light emitting device as one example of the device used for the two-step enlarged transfer method according to an embodiment of the present invention.

The light emitting device shown in the figures is a GaN based light emitting diode formed on a sapphire substrate by crystal growth. In such a GaN based light emitting diode, when the light emitting diode is irradiated with laser beams having passed through the substrate, laser abrasion occurs, to evaporate nitrogen of GaN, thereby causing film peeling at the interface between the sapphire substrate and a GaN based growth layer. As a result, the light emitting diodes can be easily peeled from the sapphire substrate.

The structure of the GaN based light emitting diode will be described below. A hexagonal pyramid shaped GaN layer 32 is formed by selective growth on an under growth layer 31 composed of a GaN based semiconductor layer. To be more specific, an insulating film (not shown) is formed on the under growth layer 31, and the hexagonal pyramid shaped GaN layer 32 is grown from an opening formed in the insulating film by a MOCVD process or the like. The GaN layer 32 is a growth layer having a pyramid shape covered with a S-plane, that is, (1-101) plane when a principal plane of the sapphire substrate used for growth is taken as a C-plane. The GaN layer 32 is a region doped with silicon. The tilt S-plane portion of the GaN layer 32 functions as a cladding portion of a double-hetero structure. An InGaN layer 33 functioning as an active layer is formed in such a manner as to cover the tilt S-plane of the GaN layer 32. A GaN layer 34 doped with magnesium is formed on the InGaN layer 33. The GaN layer 34 doped with magnesium also functions as a cladding portion.

Figure 11:
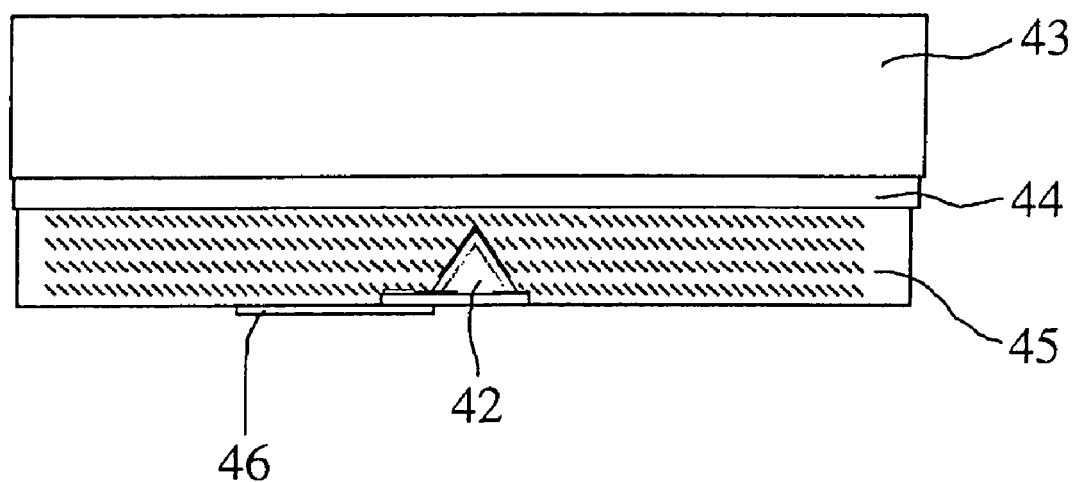
FIG. 11 is a schematic sectional view showing an electrode pad forming step according to an embodiment of the present invention.

The light emitting diode has a p-electrode 35 and an n-electrode 36. A metal material such as Ni/Pt/Au or Ni(Pd)/Pt/Au is vapor-deposited on the GaN layer 34 doped with magnesium, to form the p-electrode 35. A metal material such as Ti/Al/Pt/Au is vapor-deposited in an opening formed in the above-described insulating film (not shown), to form the n-electrode 36. If an n-electrode is extracted from the back surface side of the under growth layer 31 as shown in FIG. 11, the n-electrode 36 is not required to be formed on the front surface side of the under growth layer 31.

The GaN based light emitting diode having such a structure allows emission of blue light. In particular, the light emitting diode can be relatively simply peeled from the sapphire substrate by laser abrasion. In other words, the diode can be selectively peeled by selective irradiation of the diode with laser beams. The GaN based light emitting diode may have a structure that an active layer be formed into a planar or strip shape, or may be a pyramid structure with a C-plane formed on an upper end portion of the pyramid. The GaN light emitting diode may be replaced with any other nitride based light emitting device or a compound semiconductor device.

A concrete method of arraying the light emitting devices shown in FIGS. 6(a) to 6(d) will be described below with reference to FIGS. 10 to 16.

Figure 10:
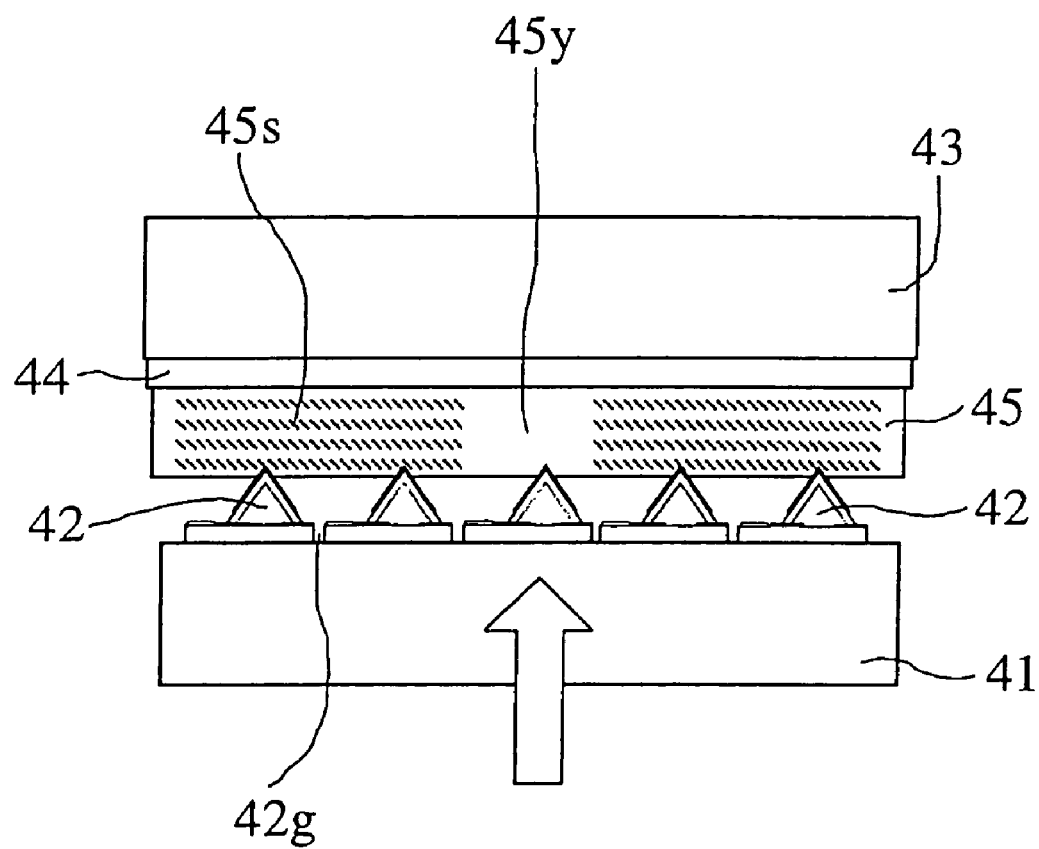
FIG. 10 is a schematic sectional view showing a first transferring step according to an embodiment of the present invention.

The GaN based light emitting diode shown in FIGS. 9(a) and 9(b) is used as the light emitting device. First, as shown in FIG. 10, a plurality of light emitting diodes 42 are formed in a matrix on a principal plane of a first substrate 41. A size of the light emitting diode 42 is set to about 20 μm. The first substrate 41 is made from a material having a high transmittance for a wavelength of a laser beam used for irradiation of the light emitting diode 42, for example, made from sapphire. The light emitting diode 42 is already provided with a p-electrode and the like but is not subjected to final wiring. Device isolation grooves 42g are already formed, to make the light emitting diodes 42 isolatable from each other. The formation of the grooves 42g may be made, for example, by reactive ion etching. As shown in FIG. 11, such a first substrate 41 is placed opposite to a temporarily holding member 43 for selective transfer of the light emitting diodes 42 therebetween.

Both a peelable layer 44 and an adhesive layer 45 are formed on a surface, opposed to the first substrate 41, of the temporarily holding member 43. As the temporarily holding member 43, there can be used a glass substrate, a quartz glass substrate, or a plastic substrate. The peelable layer 44 on the temporarily holding member 43 can be made from a fluorine coat material, a silicone resin, a water soluble adhesive (for example, polyvinyl alcohol: PVA), polyimide and/or the like. The adhesive layer 45 on the temporarily holding member 43 can be made from an ultraviolet (UV)-curing type adhesive, a thermosetting type adhesive, a thermoplastic type adhesive and/or the like. As one example, a polyimide film having a thickness of 4 μm is formed as the peelable layer 44 on the temporarily holding member 43 made from quartz glass and an UV-curing type adhesive layer having a thickness of about 20 μm is formed as the adhesive layer 45 on the peelable layer 44.

The adhesive layer 45 provided on the temporarily holding member 43 is adjusted such that cured regions 45s and non-cured regions 45y are mixed in the adhesive layer 45. The first substrate 41 is positioned to the temporarily holding member 43 such that the light emitting diodes 42 to be selectively transferred are aligned to the non-cured regions 45y. The adjustment of the adhesive layer 45 in such a manner that the cured regions 45s and the non-cured regions 45y are mixed in the adhesive layer 45 may be performed by selectively exposing portions, spaced from each other with a pitch of 200 μm, of the UV-curing type adhesive layer 45 by an exposure system, so that the portions, to which the light emitting diodes 42 are to be transferred, of the adhesive layer 45 remain non-cured and the other portions of the adhesive layer 45 are cured.

After such alignment, each of the light emitting diodes 42 to be transferred is irradiated with laser beams from the back surface side of the first substrate 41, and is then peeled from the first substrate 41 by laser abrasion. Since the GaN based light emitting diode 42 is decomposed into gallium and nitrogen at the interface between the GaN layer and sapphire, the light emitting diode 42 can be relatively simply peeled from the first substrate 41. The laser beam used for irradiation is exemplified by an excimer laser beam or a harmonic YAG laser beam.

The light emitting diode 42, which has been selectively irradiated with a laser beam, is peeled from the first substrate 41 at the interface between the GaN layer and the first substrate 41 by laser abrasion, and is transferred to the opposed temporarily holding member 43 in such a manner that the p-electrode portion of the light emitting diode 42 is pieced in the corresponding non-cured region 45$y$ of the adhesive layer 45. The other light emitting diodes 42, which are left as not irradiated with laser beams and also located at positions corresponding to those of the cured region 45$s$ of the adhesive layer 45, are not transferred to the temporarily holding member 43. It is to be noted that only one light emitting diode 42 is depicted as selectively irradiated with a laser beam in FIG. 10; however, in actual, the light emitting diodes 42 spaced from each other with an n-pitch are similarly irradiated with laser beams. With such selective transfer, the light emitting diodes 42 are arrayed on the temporarily holding member 43 in such a manner as to be enlargedly spaced from each other with a pitch larger than an original pitch of the light emitting diodes 42 arrayed on the first substrate 41.

In the state that the light emitting diode 42 is held by the adhesive layer 45 of the temporarily holding member 43, a back surface of the light emitting diode 42, which is taken as an n-electrode side (cathode electrode side), is cleaned for removal of the resin (adhesive) therefrom. Accordingly, when an electrode pad 46 is formed on the back surface of the light emitting diode 42, it can be electrically connected thereto.

As one example of cleaning the back surface of the light emitting device 42 to remove the adhesive resin of the adhesive layer 45 therefrom, the adhesive resin is etched with oxygen plasma, followed by cleaning by irradiation of UV ozone. In addition, when the GaN based light emitting diode 42 is peeled from the first substrate 41 made from sapphire by laser irradiation, gallium is deposited on the peeling plane. Such an element must be etched, for example, by using an NaOH containing water solution or dilute nitric acid. The electrode pad 46 is then patterned. At this time, the electrode pad 46 on the cathode side can be formed into a size of about 60 μm square. As the electrode pad 46, there can be used a transparent electrode (ITO or ZnO based electrode) or a Ti/Al/Pt/Au electrode. In the case of using a transparent electrode, even if the electrode largely covers the back surface of the light emitting diode 42, it does not shield light emission from the light emitting diode 42. Accordingly, a patterning accuracy of the transparent electrode may be rough and further the size of the electrode can be made large, to thereby facilitate the patterning process.

Figure 12:
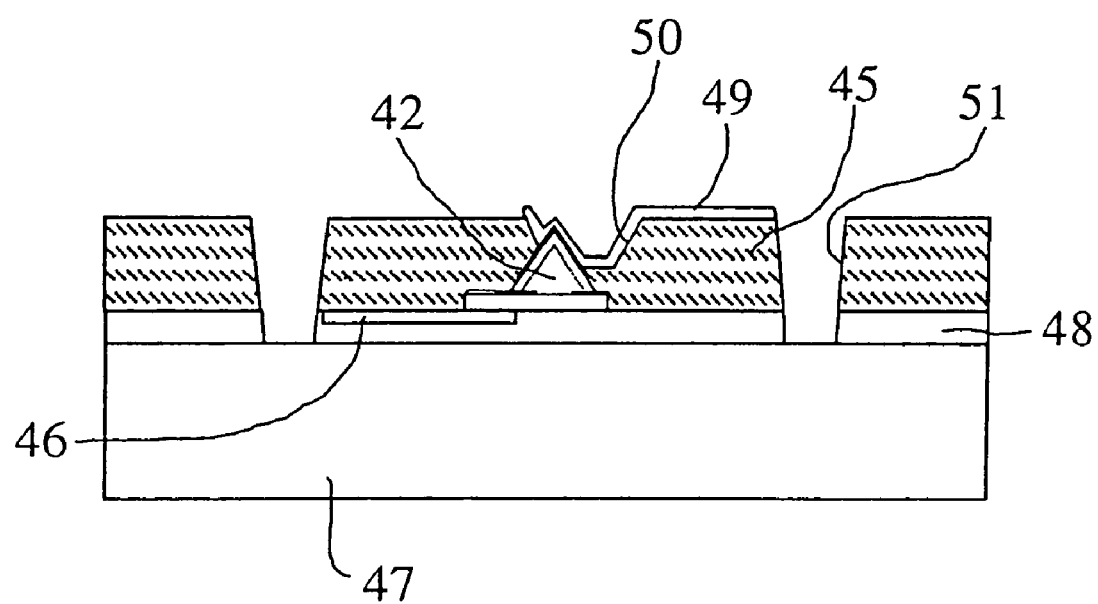
FIG. 12 is a schematic sectional view showing another electrode pad forming step performed after transfer of the devices to a second temporarily holding member according to an embodiment of the present invention.

Referring to FIG. 12, after the light emitting diode 42 is transferred from the temporarily holding member 43 to a second temporarily holding member 47, a via-hole 50 on an anode electrode (p-electrode) side is formed in the adhesive layer 45 and an anode side electrode pad 49 is formed so as to be buried in the via-hole 50, and the adhesive layer 45 made from the resin is diced. As a result of dicing, device isolation grooves 51 are formed, to make the light emitting diode 42 isolatable from those adjacent thereto. To isolate the light emitting diodes 42 arrayed in a matrix from each other, the device isolation grooves 51 have a planar pattern composed of pluralities of parallel lines extending in the vertical and horizontal directions. The bottom of the device isolation groove 51 faces to a surface of the second temporarily holding member 47.

A peelable layer 48 is previously formed on the second temporarily holding member 47. The peelable layer 48 is typically made from a fluorine coat material, silicone resin, a water soluble resin (for example, PVA), or polyimide. The second temporarily holding member 47 is exemplified by a so-called dicing sheet formed by coating a plastic substrate with an UV sticky material, wherein the sticky force of the sheet is lowered by irradiating the sticky material with UV.

The peelable layer 48 is irradiated with excimer laser beams from the back surface side of the temporarily holding member 47. As a result, if the peelable layer 44 is made from polyimide, peeling occurs at the interface between polyimide and the quartz substrate by abrasion of polyimide, so that the light emitting diode 42 can be transferred to the second temporarily holding member 47 side.

As one example of the above process of forming the anode side electrode pad 49, the surface of the second temporarily holding member 47 is etched by oxygen plasma until the surface of the light emitting diode 42 is exposed. The formation of the via-hole 50 having a diameter of about 3 to 7 μm can be made by an excimer laser beam, a harmonic YAG laser beam, or a carbon dioxide laser beam. The anode side electrode pad 49 is formed by, for example, Ni/Pt/Au. The dicing process is performed by using a usual blade, and if a narrow cut-in width of 20 μm or less is needed, the dicing process may be performed by using the above-described laser beam. The cut-in width is dependent on the size of a resin-covered chip, formed by covering the light emitting diode 42 with the adhesive layer 45 made from the resin, within a pixel of the final image display unit. As one example, the device isolation grooves having the cut-in width of about 40 μm are formed by an excimer laser beam, to form each resin-covered chip.

Figure 13:
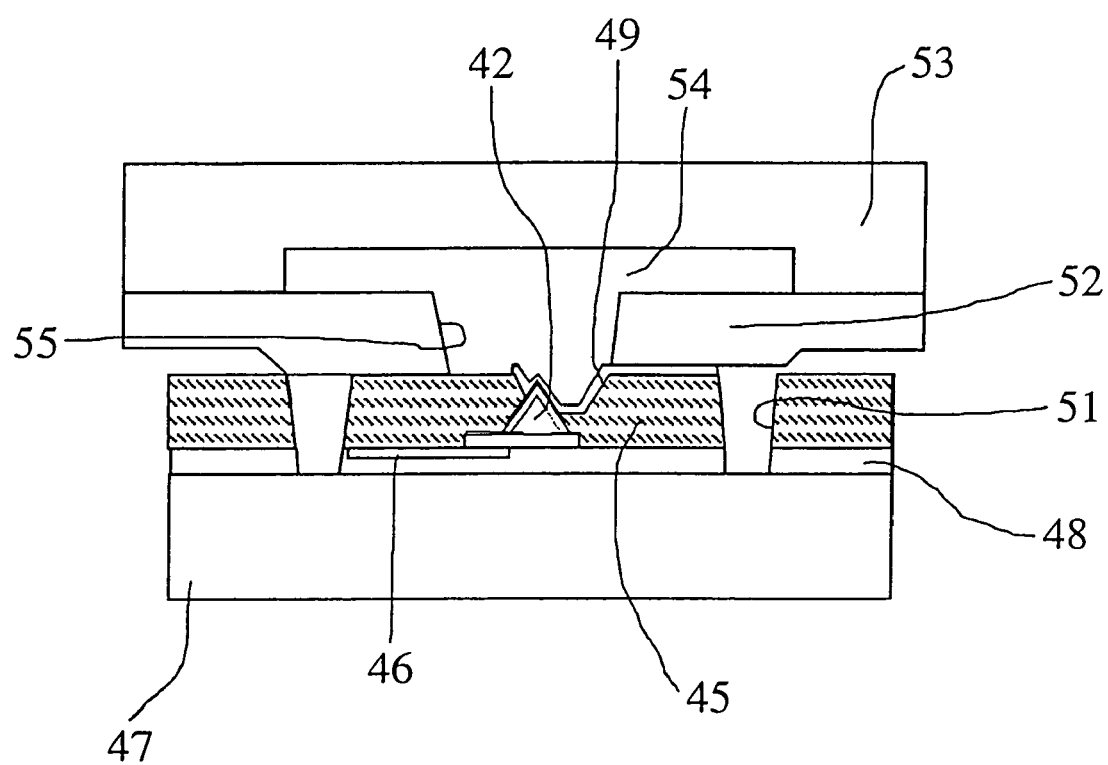
FIG. 13 is a schematic sectional view showing an attracting step according to an embodiment of the present invention.

The light emitting diode 42 is peeled from the second temporarily holding member 47 by using mechanical means. FIG. 13 is a view showing a state that each of the light emitting diodes 42 arrayed on the second temporarily holding member 47 is picked up by means of an attracting system 53. The attracting system 53 has attracting holes 55 opened in a matrix with a pitch corresponding to a pixel pitch of an image display unit in order to collectively attract a number of the light emitting diodes 42. The attracting holes 55, each having an opening diameter of about 100 μm, are arrayed into a matrix with a pitch of about 600 μm, so that the attracting system 53 can collectively attract 300 pieces of the light emitting diodes 42. As a member having the attracting holes 55, there may be used a member produced from Ni by electrocasting or a metal plate 52 such as a SUS plate, wherein the member formed by casting or the metal plate 52 is perforated by etching. An attracting chamber 54 is formed at the depth of the attracting hole 55 formed in the metal plate 52. By controlling the pressure in the attracting chamber 54 into a negative pressure, the attracting system 53 can attract the light emitting diode 42. Since each light emitting diode 42 is in a state being covered with the adhesive layer 45 with its upper surface nearly flattened, the selective attraction of the light emitting diode 42 by the attracting system 53 can be easily performed.

Figure 14:
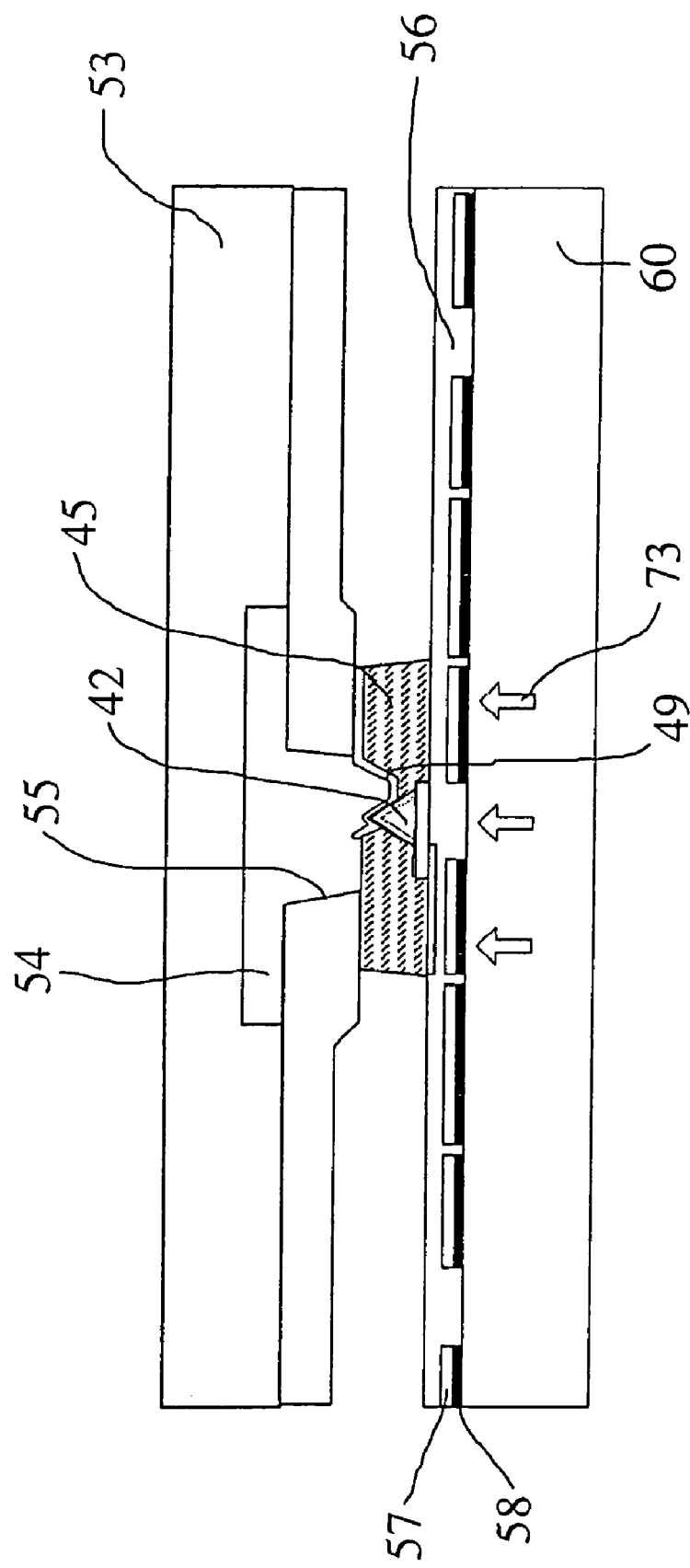
FIG. 14 is a schematic sectional view showing a second transferring step according to an embodiment of the present invention.

FIG. 14 is a view showing a state that the light emitting diode 42 is transferred to a second substrate 60 by using the above-described transfer method shown in FIG. 2(a) to FIG. 5. An adhesive layer 56 is previously formed on the second substrate 60 before the light emitting diode 42 is transferred to the second substrate 60. By curing a portion, located on the back surface of the light emitting diode 42, of the adhesive layer 56, the light emitting diode 42 is fixed on the second substrate 60. Upon this mounting, the pressure of the attracting chamber 54 of the attracting system 53 becomes high, to release the coupling state between the light emitting diode 42 and the attracting system 53 by attraction.

The adhesive layer 56 is made from a thermosetting adhesive or a thermoplastic adhesive.

The light emitting diodes 42 thus arrayed on the second substrate 60 are enlargedly spaced from each other with a pitch larger than the pitch of the light emitting diodes 42 held on the first temporarily holding member 43 and also larger than the pitch of the light emitting diodes 42 held on the second temporarily holding member 47. An energy (laser beam 73) for curing the resin of the adhesive layer 56 is given from the back surface of the second substrate 60.

As described above, only a portion, corresponding to the light emitting diode 42 in the form of the resin-covered chip (light emitting diode 42 covered with the adhesive layer 45), of the adhesive layer 56 is irradiated with laser beams 73 from the back surface side of the second substrate 60, to be heated. If the adhesive layer 56 is made from a thermoplastic adhesive, the heated portion of the adhesive layer 56 is softened, and is cooled to be cured, whereby the resin-covered chip is fixed to the second substrate 60. Similarly, if the adhesive layer 56 is made from a thermosetting adhesive, only the portion, irradiated with the laser beams 73, of the adhesive layer 56 is cured, whereby the resin-covered chip is fixed to the second substrate 60.

An electrode layer 57 serving as a shadow mask may be disposed on the second substrate 60. In this case, by irradiating a portion, corresponding to the above target portion of the adhesive layer 56, of the electrode layer 57 with the laser beams 73 so as to heat the portion of the electrode layer 57, the target portion of the adhesive layer 56 can be indirectly heated. In particular, a black chromium layer 58 may be formed on a surface, on the screen side, that is, on the viewer side, of the electrode layer 57. With this provision of the black chromium layer 58, it is possible to improve the contrast of an image, and also to increase an energy absorptivity of the electrode layer 57 via the black chromium layer 58 and hence to efficiently heat the target portion of the adhesive layer 56 by selectively irradiated laser beams 73.

Figure 15:
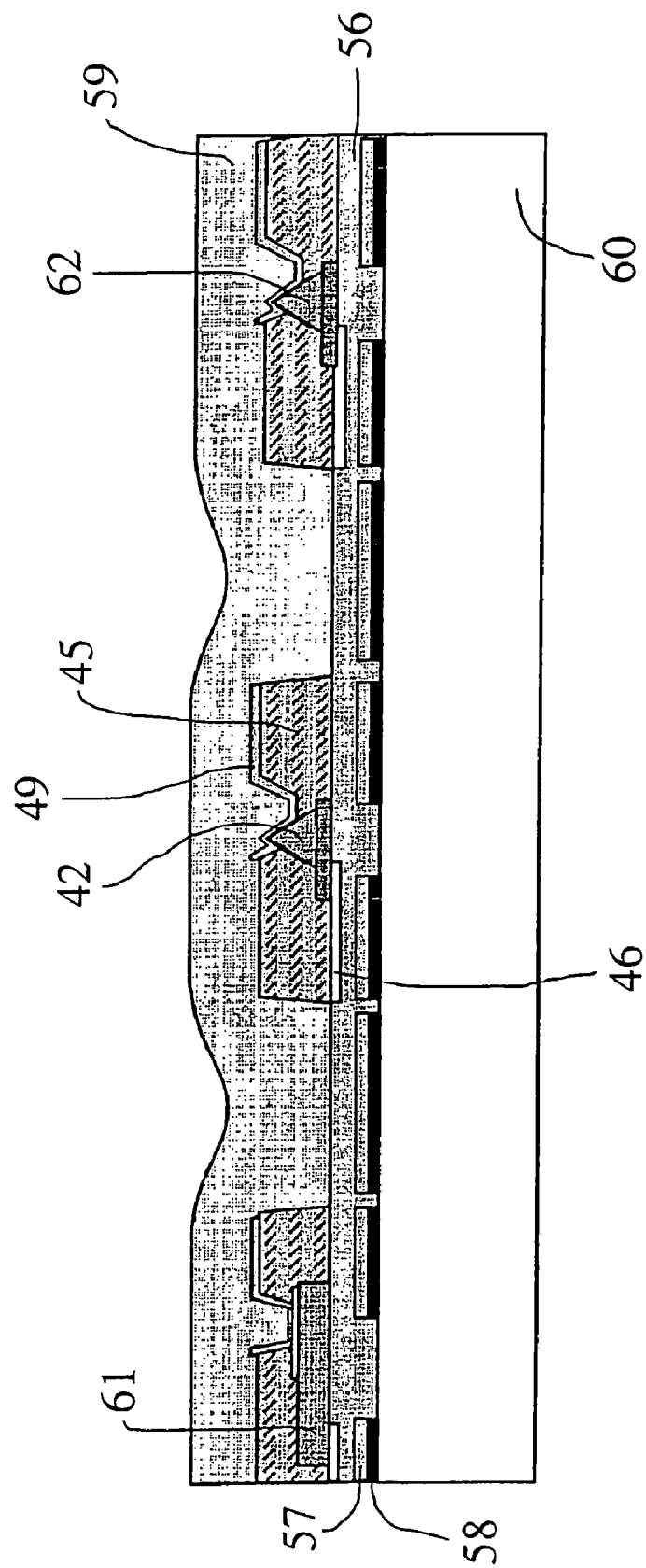
FIG. 15 is a schematic sectional view showing an insulating film forming step according to an embodiment of the present invention.

FIG. 15 is a view showing a state that light emitting diodes 42, 61, and 62 of three colors, RGB are arrayed on the second substrate 60 and are coated with an insulating layer 59. The light emitting diodes 42, 61, and 62 can be respectively mounted on the second substrate 60 at positions offset from each other in the order of the three colors by using the attracting system 53 shown in FIGS. 13 and 14, whereby a pixel composed of the light emitting diodes 42, 61 and 62 of RGB can be formed with a pixel pitch fixed. The insulating layer 59 may be made from a transparent epoxy adhesive, UV-curing type adhesive, or polyimide. The shapes of the light emitting diodes 42, 61, and 62 of the three colors are not necessarily identical to each other. In the example shown in FIG. 15, the red light emitting diode 61 has a structure having no hexagonal pyramid shaped GaN layer, and is different in shape from each of the other light emitting diodes 42 and 62; however, since in this stage, each of the light emitting diodes 42, 61, and 62 has been already covered with the adhesive layer 45 to be formed into a resin-covered chip, the light emitting diodes 42, 61, and 62 can be handled in the same manner irrespective of the difference in device structure.

Figure 16:
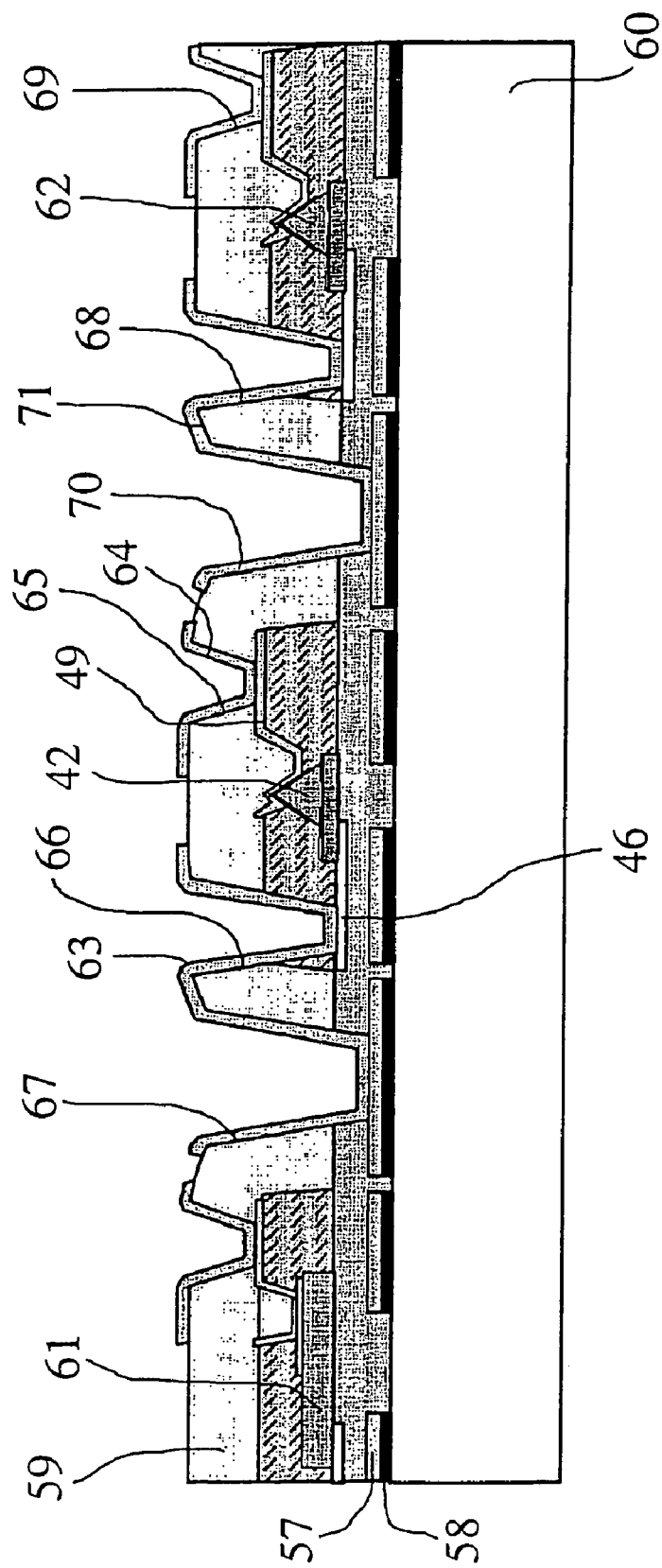
FIG. 16 is a schematic sectional view showing a wiring forming step according to an embodiment of the present invention.

FIG. 16 is a view showing a wiring formation step. Opening portions 65, 66, 67, 68, 69, and 70 are formed in the insulating layer 59, and wiring portions 63, 64 and 71 for connecting the electrode pads for the anode and cathode of each of the light emitting diodes 42, 61 and 62 to the electrode layer 57 for wiring on the second substrate 60 are formed in the opening portions 65, 66, 67, 68, 69 and 70. Since the areas of the electrode pads 46 and 49 of each of the light emitting diodes 42, 61, and 62 are large, the shapes of the opening portions, that is, via-holes can be made large. As a result, each via-hole can be formed with a rough positioning accuracy as compared with a via-hole directly formed in each light emitting diode. For each of the electrode pads 46 and 49 having a size of about 60 μm square, the via-hole having a diameter of about 20 μm can be formed. The via-holes are of three kinds having different depths: the first kind is connected to the wiring substrate, the second kind is connected to the anode electrode, and the third kind is connected to the cathode electrode. The depth of each via-hole is optimized by controlling the pulse number of a laser beam depending on the kind of the via-hole. A protective layer is then formed on the wiring, to accomplish a panel of an image display unit. The protective layer may be made from the same transparent epoxy adhesive as that used for the insulating layer 59 shown in FIG. 17. The protective layer is heated to be cured, to perfectly cover the wiring. A driver IC is then connected to the wiring at the end portion of the panel, to produce a drive panel.

In the above-described method of arraying light emitting devices according to an embodiment of the present invention, since the light emitting diodes 42 are already enlargedly spaced from each other when being held on the temporarily holding member 43, the relatively large electrode pads 46 and 49 can be provided by making use of the large distance between adjacent two of the light emitting diodes 42.

Since the wiring is performed by making use of the relatively large electrode pads 46 and 49, even if the size of the final unit is significantly larger than the device size, the wiring can be easily formed. According to the method of arraying light emitting devices in this embodiment, since each light emitting device 42 is covered with the flattened cured adhesive layer 45, the electrode pads 46 and 49 can be accurately formed on the front and back surfaces of the flattened adhesive layer 45 and can be also disposed to extend to a region wider than the device size, so that the handling of the light emitting device 42 by the attracting jig in the second transferring step can be facilitated. In the transfer of the light emitting diode 42 to the temporarily holding member 43, the light emitting diode 42 can be relatively simply peeled to be certainly transferred by making use the phenomenon that GaN material is decomposed into gallium and nitrogen at the interface between the GaN material and sapphire. Since the transfer (second transferring step) of the resin-covered chip to the second substrate is performed by selectively heating the adhesive layer by laser irradiation and curing the adhesive layer, only the resin-covered chip to be transferred can be certainly transferred without exerting any effect on the adhesive state of other parts.

An embodiment, which carries out each of the device transferring method, the device arraying method, and the image display unit fabricating method according to the present invention, will be described below. As referred to below, parts corresponding to those parts previously described are denoted by the same reference numerals and therefore the detailed description thereof is omitted.

In an embodiment, an adhesive layer equivalent to the adhesive layer 7 described above contains a light absorbing material for increasing a light absorptivity of the adhesive layer against laser beams.

The light absorbing material for increasing a light absorptivity of the adhesive layer may be disposed in the vicinity of the adhesive layer. As such a light absorbing material contained in the adhesive layer or disposed in the vicinity of the adhesive layer, there may be used a metal thin film made from chromium or aluminum, or a particulate material such as carbon black or calcium carbonate. If a light absorbing material for increasing a light absorptivity of an adhesive layer against laser beams is used in the form of a metal thin film, the metal thin film may be formed on the surface, to be adhesively bonded to the adhesive layer, of a device to be transferred, or formed on the surface, to be adhesively bonded to the device, of the adhesive layer. Meanwhile, if a light absorbing material is used in the form of a particulate material, the particulate material may be contained in the adhesive layer, or formed on the surface, to be adhesively bonded to the adhesive layer, of a device.

In the device transferring method according to the first embodiment, as shown in FIG. 3, a portion, being in contact with the device 3a to be transferred, of the adhesive layer 7 is selectively irradiated with the laser beams L from the back surface side of the transfer substrate 6 to be heated, whereby the heated region H of the adhesive layer 7 made from a thermoplastic adhesive resin is cured to exhibit an adhesive force against the device 3a. In this laser irradiation, according to the second embodiment, since the adhesive layer 7 contains a light absorbing material 7a for increasing a light absorptivity of the adhesive layer 7 against the laser beams L, the portion, corresponding to the device 3a, of the adhesive layer 7 efficiently absorbs the laser beams L, to be thus desirably heated. As a result, it is possible to efficiently, selectively heat the portion, corresponding to the device 3a to be transferred, of the adhesive layer 7. In this way, according to this embodiment, the presence of the light absorbing material 7a allows the portion, corresponding to the device 3a, of the adhesive layer 7 to be efficiently, selectively heated.

The presence of the light absorbing material 7a has another advantage that since the laser beams L are absorbed by the light absorbing material 7a for increasing a light absorptivity of the adhesive layer 7 against the laser beams L, and therefore, the laser beams L do not reach the device 3a, it is possible to prevent the device 3a from being damaged by the laser beams L.

After the irradiation of the laser beams L is stopped, the heated region H of the adhesive layer 7 is cooled to be cured, whereby the device 3a is fixed to the transfer substrate 6 via the adhesive layer 7. At this time, since the adhesive layer 7 contains the light absorbing material 7a for increasing a light absorptivity of the adhesive layer 7 against the laser beams L, the laser beams L are absorbed by the light absorbing material 7a, with a result that the portion, corresponding to the device 3a, of the adhesive layer 7 can be efficiently, selectively heated.

The adhesive layer 7 containing the light absorbing material 7a for increasing a light absorptivity of the adhesive layer 7 against the laser beams L can be performed in another manner. In the device transferring method according to the first embodiment, as shown in FIG. 3, the device 3a to be transferred is irradiated with the laser beams L having passed through the adhesive layer 7, to indirectly heat the portion, corresponding to the device 3a, of the adhesive layer 7. In this laser irradiation manner, according to the second embodiment, since the light absorbing material 7a for increasing a light absorptivity of the adhesive layer 7 against the laser beams is contained in the adhesive layer 7 (or disposed in the vicinity of the adhesive layer 7), the laser beams L are absorbed by the light absorbing material 7a having a light absorptivity against the laser beams L, with a result that the laser beams L do not reach the device 3a, thereby preventing the device 3a from being damaged by the laser beams L.

Even in the case of indirectly heating the portion, corresponding to the device 3a to be transferred, of the adhesive layer 7 by irradiating the portion H, being in contact with the adhesive layer 7, of the device 3a with the laser beams L so as to heat the portion H or by irradiating a wiring portion formed on the transfer substrate 6 with the laser beams L so as to heat the wiring portion, since the laser beams L are absorbed by the light absorbing material 7a for increasing a light absorptivity of the adhesive layer 7, with a result that the laser beams L do not reach the device 3a, thereby preventing the device 3a from being damaged from the laser beams L.

Since the light absorbing material having a light absorptivity against the laser beams L prevents the laser beams L from reaching the device 3a, the laser beams L do not reach the device 3a. As a result, it is possible to freely select the kind and wavelength of the laser irrelevant to the material of the device 3a without taking into account the fact that the device 3a is damaged by the laser beams L.

By selecting a material having a known absorption characteristic against the laser beams L as the light absorbing material 7a for increasing a light absorptivity of the adhesive layer 7 against the laser beams, it is possible to estimate a heat generation amount upon heating by laser irradiation, and to select the material irrelevant to the absorption characteristic against the laser beams L as the material of the device 3a.

Although the description has been made by way of the example that the adhesive layer 7 is made from a thermoplastic adhesive layer, the selective transfer of devices can be performed in the same manner as that described above even if the adhesive layer 7 is made from a thermosetting adhesive resin. In the case of using the adhesive layer 7 made from a thermosetting resin, a portion, irradiated with the laser beams L, of the adhesive layer 7 is thermally cured, to fix the device to the transfer substrate.

Figure 17:
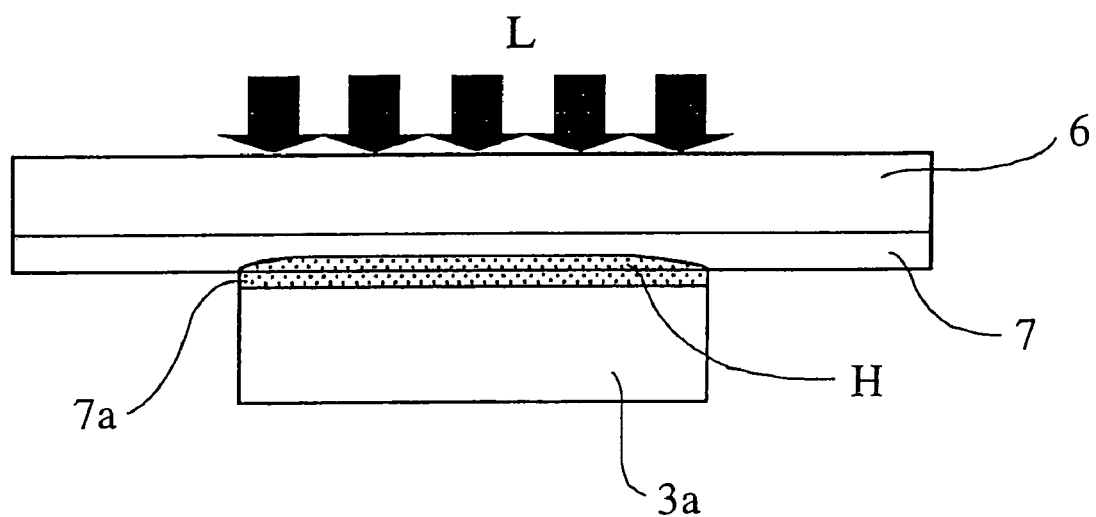
FIG. 17 is a schematic view showing a state that a light absorbing material for increasing a light absorptivity of an adhesive layer against laser beams is disposed and the device is heated by laser beams according to an embodiment of the present invention.

FIG. 17 shows a state that the light absorbing material 7a for increasing a light absorptivity of the adhesive layer 7 against the laser beams L is disposed on the surface, on the adhesive layer 7 side, of the device 3a to be transferred, to heat the portion, corresponding to the device 3a, of the adhesive layer 7. Even in this case, like the case where the light absorbing material 7a is contained in the adhesive layer 7, the laser beams L are absorbed by the light absorbing material 7a having a high light absorptivity against the laser beams L, with a result that the laser beams L do not reach the device 3a or the wiring portion, thereby preventing the device 3a or the wiring portion from being damaged by the laser beams L.

A device arraying method and an image display unit fabricating method using the above-described device transferring method according to an embodiment of the present invention will be described below. The two-step enlarged method used for the device arraying method and the image display unit fabricating method are the same as previously described, and therefore, the overlapped description thereof is omitted.

In an embodiment, in the concrete method of arraying light emitting devices shown in FIGS. 10 to 16, a light absorbing material for increasing a light absorptivity against laser beams is contained in each of the adhesive layers 45 and 56.

According to the device arraying method and the image display unit fabricating method in an embodiment, in the step of transferring the light emitting diode 42 to the second substrate 60, the adhesive layer 56 shown in FIG. 14 can be made from a thermosetting adhesive or a thermoplastic adhesive, and contains a light absorbing material 56a for increasing a light absorptivity of the adhesive layer 56 against the laser beams L. As the light absorbing material 56a contained in the adhesive layer 56, there may be used calcium carbonate, carbon or other like materials.

Here, the adhesive layer 56 can be made from a thermosetting adhesive or a thermoplastic adhesive, and contains a light absorbing material 56a for increasing a light absorptivity of the adhesive layer 56 against the laser beams L. As the light absorbing material 56a contained in the adhesive layer 56, there may be used calcium carbonate, carbon or the like.

The light emitting diodes 42 arrayed on the second substrate 60 are enlargedly spaced from each other with a pitch larger than the pitch of the light emitting diodes 42 held on the first temporarily holding member 43 and also larger than the pitch of the light emitting diodes 42 held on the second temporarily holding member 47. An energy for curing the resin of the adhesive layer 56 is given from the back surface of the second substrate 60.

As described above, only a portion, corresponding to the light emitting diode 42 in the form of the resin-covered chip (light emitting diode 42 covered with the adhesive layer 45), of the adhesive layer 56 is irradiated with the laser beams 73 from the back surface side of the second substrate 60, to be heated. If the adhesive layer 56 is made from a thermoplastic adhesive, the heated portion of the adhesive layer 56 is softened, and is cooled to be cured, whereby the resin-covered chip is fixed to the second substrate 60. Similarly, if the adhesive layer 56 is made from a thermosetting adhesive, only the portion, irradiated with the laser beams 73, of the adhesive layer 56 is cured, whereby the resin-covered chip is fixed to the second substrate 60.

In this case, by irradiation of the laser beams 73 from the back surface side of the second substrate 60, the portion, corresponding to the light emitting diode 42, of the adhesive layer 56 can be selectively heated directly or indirectly via the light emitting diode 42 and the electrode layer 57 without heating the portions, near the light emitting diodes not to be transferred, of the adhesive layer 56. Further, by containing the light absorbing material 56a for increasing a light absorptivity of the adhesive layer 56 against the laser beams 73 in the adhesive layer 56, the laser beams 73 can be more desirably absorbed in the portion, corresponding to the light emitting device 42, of the adhesive layer 56. As a result, it is possible to efficiently, selectively heat the portion, corresponding to the light emitting diode 42, of the adhesive layer 56.

In the above-described method of arraying light emitting diodes, since the device transferring method according to the second embodiment is used, that is, since the light absorbing material 56a for increasing a light absorptivity of the adhesive layer 56 against the laser beams 73 is contained in the adhesive layer 56, it is possible to efficiently, selectively heat the portion, corresponding to each light emitting diode 42 to be transferred, of the adhesive layer 56, and hence to efficiently array the light emitting diodes 42.

The presence of the light absorbing material 56a for increasing a light absorptivity of the adhesive layer 56 against the laser beams 73 has another advantage that since the laser beams 73 are absorbed by the light absorbing material 56a and therefore the laser beams 73 do not reach the light emitting diode 42, with a result that the light emitting diode 42 is prevented from being damaged by the laser beams 73. As a result, it is possible to array the light emitting diodes 42 without damaging the light emitting diodes 42 by the laser beams 73.

In the device transferring method according to an embodiment, since the kind of the laser beam is not dependent on the material of the device to be transferred, it is possible to freely select the kind of the laser, and since the light absorbing material 56a for increasing a light absorptivity of the adhesive layer 56 can be simply provided by containing the light absorbing material 7a in the adhesive layer 56 and coating the overall surface of the second substrate 60 with the adhesive layer 56, it is possible to array the light emitting diodes 42 by a simple process.

A further advantage of the device transferring method according to an embodiment is that since the time required for irradiating each light emitting diode 42 to be transferred with the laser beams 73 is short because of efficient heating the portion, corresponding to the light emitting diode 42, of the adhesive layer 56 and the portions, corresponding to the light emitting diodes not to be transferred, of the adhesive layer 56 are not heated, the light emitting diodes 42 to be transferred can be certainly, accurately arrayed without exerting adverse effect on the fixed states of the other light emitting diodes, that is, without peeling and positional deviation of the light emitting diodes other than the light emitting diodes 42 to be transferred.

An embodiment, which carries out each of the device transferring method, the device arraying method, and the image display unit fabricating method according to the present invention, will be described below. As referred to below, parts corresponding to those parts previously described are denoted by the same reference numerals and therefore the detailed description thereof is omitted.

Figure 18A:
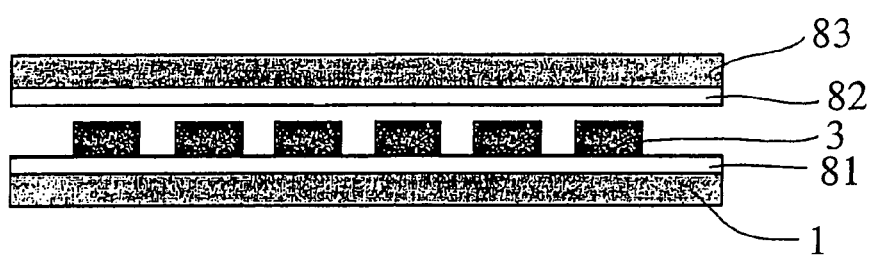

A device transferring method according to an embodiment of the present invention will be described below. To transfer devices 3 in accordance with the device transferring method of the present invention, as shown in FIG. 18(a), a thermal re-peelable layer 81 is formed on a base substrate 1 as a supply source, and a plurality of devices are formed in array on the base substrate 1.

The thermal re-peelable layer 81 has a property that the sticky force thereof is reduced when the layer 81 is heated. The thermal re-peelable layer 81 having such a property makes a member adhesively bonded to the layer 81 re-peelable therefrom. Accordingly, in the case of forming the thermal re-peelable layer 81 on the base substrate 1 and forming the devices 3 in array on the thermal re-peelable layer 81, the devices 3 can be simply transferred to another substrate.

Figure 19:
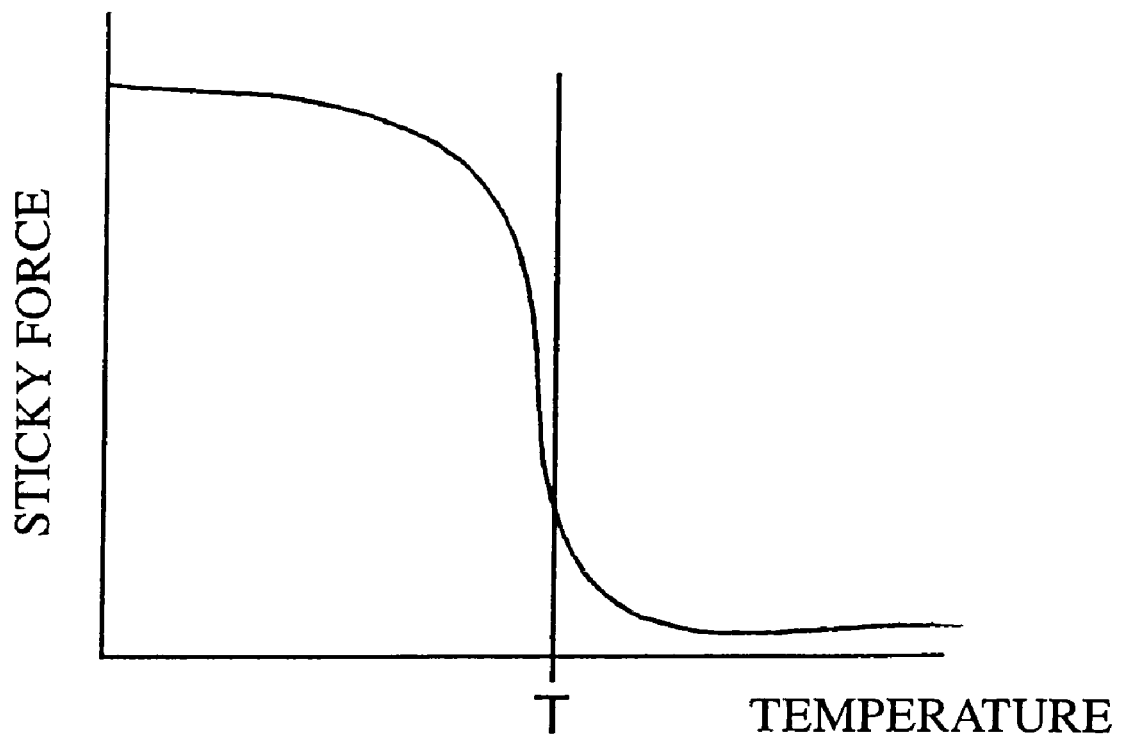
FIG. 19 is a characteristic diagram showing a relationship between a temperature and a sticky force of a thermal peelable material according to an embodiment of the present invention.

As the thermal re-peelable layer 81, there can be desirably used a sheet made from a thermoplastic resin or a thermal peelable material. In the case of using a thermoplastic resin as the material of the thermal re-peelable layer 81, the thermoplastic resin is plasticized when the thermal re-peelable layer 81 is heated, to reduce an adhesive force between the thermal re-peelable layer 81 and each device 3, whereby the device 3 can be easily peeled from the thermal re-peelable layer 81. In the case of using a thermal peelable resin as the material of the thermal re-peelable layer 81, as shown in FIG. 19, a sticky force of the thermal peelable material is rapidly reduced at a specific temperature, whereby the device 3 can be easily peeled from the thermal re-peelable layer 81. The temperature at which the sticky force of the thermal peelable material is rapidly reduced, that is, a temperature T shown in FIG. 19 differs depending on the kind of the thermal peelable material, and for example, the temperature T ranges from 80° C. to 170° C.

The thermal peelable material is a material capable of reducing its sticky force by a foaming or expansion treatment due to heating, thereby making a member adhesively bonded to the material simply peelable therefrom. Specifically, when the thermal peelable material is heated, a foaming agent or an expanding agent contained in the material is foamed or expanded, to reduce the sticky area of the material, thereby losing the sticky force of the material. For example, a heating re-peelable type sticky sheet composed of a base material and a sticky layer containing a foaming agent provided thereon is disposed, for example, in Japanese Patent Laid-open Nos. Sho 50-13878 and Sho 51-24534, and Japanese Patent Publication Nos. Sho 56-61468, Sho 56-61469, and Sho 60-252681. A heating peelable type sticky sheet composed of a thermal expandable layer containing thermal expandable micro-balls and thereby being expandable by heating and a non-expandable sticky layer provided at least one surface of the thermal expandable layer is disclosed, for example, in Japanese Patent Laid-open No. 2000-248240. A heating peelable type sticky sheet configured such that a thermal expandable layer containing thermal expandable micro-balls and a sticky layer containing a sticky material are provided at least on one surface of a base material having a heat resistance and a flexibility is disclosed, for example, in Japanese Patent Laid-open No. 2000-169808.

In the above-described heating peelable type sticky sheets, the thermal expandable layer containing thermal expandable micro-balls acts as follows: namely, when heated, the thermal expandable layer is expanded and thereby the surface thereof is irregularly deformed, with a result that the surface of the sticky layer provided on the thermal expandable layer is correspondingly irregularly deformed, to reduce the adhesive force thereof against a member adhesively thereto. Accordingly, the member adhesively bonded to the heating peelable type sticky sheet can be simply peeled therefrom at any time by heating the thermal expandable layer of the heating peelable type sticky sheet.

The thermal expandable layer can be formed by mixing thermal expandable micro-balls with a binder. The binder is exemplified by a polymer or a wax allowing foaming and/or expansion of the thermal expandable micro-balls due to heating. In particular, from the viewpoint of controlling the heating expansion characteristic of thermal expandable micro-balls and the sticking characteristic such as a sticky force against a member bonded to a sticky layer via the sticky layer, a sticker is preferably used as the binder. The sticker is not particularly limited but may be selected from polymers such as a rubber based polymer, an acrylic based polymer, a vinyl alkyl ether based polymer, a silicone based polymer, a polyester based polymer, a polyamide based polymer, an urethane based polymer, a fluorine based polymer, and a styrene-diene copolymer. Such a polymer may be added with a thermally molten resin having a melting point of about 200° C. or less for improving the creep characteristic of the polymer. The sticker may be an ultraviolet-curing type polymer. The above polymer used for the sticker may be further added with one or more additives such as a crosslinking agent, a tackifier, a plasticizer, a softener, a filler, a pigment, a coloring agent, an antioxidant, and a surface active agent.

As the thermal expandable micro-balls contained in the thermal expandable layer, there may be used micro-capsules formed by enclosing a material easily gasified to exhibit a thermal expansion characteristic, such as isobutane, propane, or pentane in shells made from a shell forming material by a coagervation method or an interfacial polymerization method. As the shell forming material, there may be used a thermally molten material or a material allowed to be broken by thermal expansion, for example, vinylidene chloride-acrylonitrile copolymer, polyvinyl alcohol, polyvinyl butyral, polymethyl methacrylate, polyacrylonitrile, polyvinylidene chloride, polysulfone and/or the like. The average particle size and the content of the thermal expandable micro-balls may be suitably set in accordance with an expansion magnification of the thermal expandable layer and the degree of reduction in sticky force.

The base material of the heating peelable type sticky sheet functions as a support for the thermal expandable sticky layer and the like, and is configured as a material having a flexibility and a heat resistance being large enough to keep the mechanical properties even by the treatment of heating the thermal expandable sticky layer. The base material is exemplified by a heat stabilizer containing soft polyvinyl chloride film or sheet, an expandable polyester film or sheet, a soft polyolefine film or sheet, a rubber base polymer sheet, or a multi-layer film or sheet including the above films or sheets.

The elongation percentage after fracture of the film or sheet forming the base material, specified under JIS K7113 (for sheet) or JIS K7127 (for film), is generally in a range of about 100% or more, preferably, in a range of 250% or more. The upper limit of the elongation percentage after fracture is not particularly limited. The thickness of the base material may be freely selected insofar as it does not obstruct the workability.

The thermal expandable sticky layer contains a sticky material for giving stickiness, and thermal expandable micro-balls for giving a thermal expansion characteristic. As the sticky material, there may be used a general sticker or adhesive, for example, a thermal activation type sticker, a water or organic solvent activation type sticker, or a pressure-sensitive sticker.

The sticky layer may contain, in addition to the sticky material, one or more additives, for example, a crosslinking agent such as an isocyanate based crosslinking agent or an epoxy based crosslinking agent, a tackifier such as a rosin derivative resin, a polyterpene resin, a petroleum resin, or an oil soluble resin, a plasticizer, a filler, and an antioxidant.

The thermal expandable micro-balls contained in the thermal expandable sticky layer may be micro-balls formed by enclosing a material easily gasified by heating to exhibit the thermal expansion characteristic such as isobutane, propane, or pentane in an elastic shell. The shell is made from a thermoplastic material, a thermal molten material, or a material allowed to be broken by thermal expansion. Examples of such a shell forming material include vinylidene chloride-acrylonitrile copolymer, polyvinyl alcohol, polyvinyl butyral, polymethyl methacrylate, polyacrylonitrile, polyvinylidene chloride, or polysulfone. The thermal expandable micro-balls can be produced by a usual method such as a coagervation method or an interfacial polymerization method.

The average particle size of the thermal expandable micro-balls is preferably in a range of 1 to 50 μm from the viewpoint of its dispersibility or thin layer formability. To efficiently reduce the sticky force of the sticky layer containing a sticky material by heating, the strength of the thermal expandable micro-balls is preferably large enough to prevent the breakage of the micro-balls until the volume expansion magnification thereof becomes 5 times or more, particularly, 10 times or more.

The content of the thermal expandable micro-balls is dependent on the kind thereof, and is generally in a range of 10 to 200 parts by weight, preferably, 25 to 125 parts by weight on the basis of the 100 parts by weight of the base polymer forming the thermal expandable sticky layer.

The thermal re-peelable layer 81 may be formed on the overall surface of a principal plane, on the side on which the devices 3 are to be arrayed, of the base substrate 1, or selectively formed on the principal plane of the base substrate 1 at positions corresponding to those f the devices 3. In the case of forming the thermal re-peelable layer 81 by coating, however, it is desirable to uniformly form the thermal re-peelable layer 81 on the overall surface from the viewpoint of simplifying the process.

The base substrate 1 may be made from any material selected in consideration of a combination with the devices 3; however, according to this embodiment, the base substrate 1 is preferably made from a material having a heat resistance allowing material to withstand even in the subsequent heating step and a low expansion characteristic.

As the device 3, there can be used any type of device, examples of which include a light emitting device, a liquid crystal control device, a photoelectric transfer device, a piezoelectric device, a thin film transistor device, a thin film diode device, a resistance device, a switching device, a micro-magnetic device, and a micro-optical device.

Here, it is not required for the sticky force of the thermal re-peelable layer 81 to be perfectly eliminated by heating but it is sufficient for the sticky force between the thermal re-peelable layer 81 and each device 3 becomes smaller than the sticky force between a thermoplastic adhesive layer 82 (to be described later) and the device 3 at a specific heating temperature. To be more specific, if the sticky force between the thermal re-peelable layer 81 and the device 3 becomes smaller than the sticky force between the thermoplastic adhesive layer 82 and the device 3, when a transfer substrate 82 is peeled from the base substrate 1 as will be described later, the device 3 can be transferred from the base substrate 1 to the transfer substrate 83.

To more certainly transfer the device 3, however, it may be desirable to set the combination of the thermal re-peelable layer 81 and the thermoplastic adhesive layer 82 so that the sticky force between the thermal re-peelable layer 81 and the device 3 becomes very smaller than the sticky force between the thermoplastic adhesive layer 82 and the device 3.

As shown in FIG. 18(a), the thermoplastic adhesive layer 82 is formed on a principal plane, taken as a transfer plane of the devices 3, on the transfer substrate 83. The transfer substrate 83 is disposed in a specific positional relationship with the base substrate 1 such that the devices 3 are opposed to the thermoplastic adhesive layer 82.

The transfer substrate 82 may be made from any material selected in consideration of a combination with the devices 3 and an application; however, according to this embodiment, the transfer substrate 83 is preferably made from a material having a heat resistance allowing material to withstand even in the subsequent heating step and a low expansion characteristic.

The thermoplastic adhesive layer 82 is made from a material capable of generating an adhesive force by heating, thereby allowing the devices 3 to be adhesively bonded to the transfer substrate 83 via the thermoplastic adhesive layer 82. Such a material is exemplified by a thermoplastic resin or a solder. The thermoplastic adhesive layer 82 may be formed overall on the transfer plane of the transfer substrate 83, or formed partially on the transfer plane at positions corresponding to those of the devices 3.

Figure 18B:
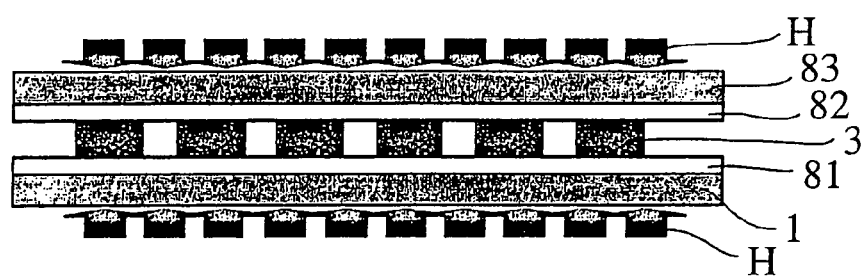

To transfer the devices 3, as shown in FIG. 18(b), the transfer substrate 83 is disposed in a specific positional relationship with the base substrate 1 and is then brought into press-contact therewith, and in such a state, the thermal re-peelable layer 81 is heated by giving heat H to the overall surface by a heat source such as an oven, to reduce the sticky force of the thermal re-peelable layer 81 against the devices 3, whereby the devices 3 become peelable from the thermal re-peelable layer 81. The thermoplastic adhesive layer 82 is softened by heating the layer 82, and is then cooled to be cured, to fix the devices 3 to the thermoplastic adhesive layer 82. That is to say, the softened thermoplastic adhesive layer 82 exhibits an adhesive force against the devices 3. When the thermoplastic adhesive layer 82 is softened, the heating is stopped, to cool and cure the thermoplastic adhesive layer 82, so that the devices 3 are transferred to the transfer substrate 83 via the thermoplastic adhesive layer 82. The transfer substrate 83 is then peeled from the base substrate 1, and the thermoplastic adhesive layer 82 is cooled to room temperature, whereby the devices 3 are certainly fixed to the transfer substrate 83. The transfer step is thus accomplished.

Figure 18C:
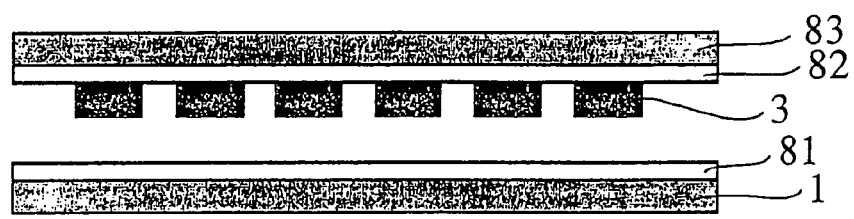

FIG. 18(c) shows a state after the transfer substrate 83 is peeled from the base substrate 21, wherein the devices 3 are left as transferred on the thermoplastic adhesive layer 82.

In this way, the devices 3 can be transferred from the base substrate 1 to the transfer substrate 83.

In the device transferring method according to the third embodiment described above, since the peeling of the devices 3 from the base substrate 1 and the adhesive bonding of the devices 3 to the transfer substrate 83 can be performed only by the heating process, it is possible to eliminate the need of providing an attracting head and an ultraviolet irradiation apparatus, which has been required in the case of using an ultraviolet reactive type material, and hence to transfer the devices 3 with a simple configuration. Since the transfer process is simple, the positioning of the devices 3 can be easily, certainly performed, so that it is possible to accurately transfer the devices without occurrence of any positional deviation in transferred devices. Further, by positioning a reference one of the devices 3 to be transferred at a specific position, the other devices to be transferred are collectively positioned at specific positions, it is possible to accurately transfer the devices without occurrence of any deviation in mounting position of each device.

According to this device transferring method pursuant to an embodiment of the present invention, since the peeling of the devices 3 from the base substrate 1 and the adhesive bonding of the devices 3 to the transfer substrate 83 are substantially, simultaneously performed, it is possible to transfer the devices 3 for a short time, and hence to significantly shorten the mounting time of the devices 3.

According to this device transferring method pursuant to an embodiment of the present invention, since the devices 3 are fixed to the transfer substrate 83 by using the thermoplastic adhesive layer 82, if the transfer position of a device 3 is needed to be corrected or a device 3 is peeled for some reason, it is possible to peel the device 3 by re-heating the thermoplastic adhesive layer 82.

If the thermoplastic adhesive layer 82 is made from a solder, the thermoplastic adhesive layer 82 is able to serve as wiring. In this case, it is possible to omit a wiring formation step and hence to simplify a process of fabricating an electronic part or the like, and it is possible to simplify the configuration of an electronic parts or the like and hence to reduce the cost of the electronic part.

According to this device transferring method pursuant to an embodiment of the present invention, the devices 3 are fixed to the base substrate 1 by using the thermal re-peelable layer. If the devices 3 are fixed to the base substrate 1 by using an ultraviolet-curing type resin, the ultraviolet-curing resin is cured by heating to be adhesively bonded, thereby failing to transfer the devices 3 to the transfer substrate. Further, in this case, the transfer of the devices requires both a process of irradiating the ultraviolet-curing resin with ultraviolet rays and a process of heating the thermoplastic adhesive layer 82, so that the transfer work is complicated. On the contrary, according to this transfer method, since the devices 3 are fixed to the base substrate 1 by using the thermal re-peelable layer, it is possible to simply, certainly transfer the devices 3 from the base substrate 1 to the transfer substrate.

Figure 20:
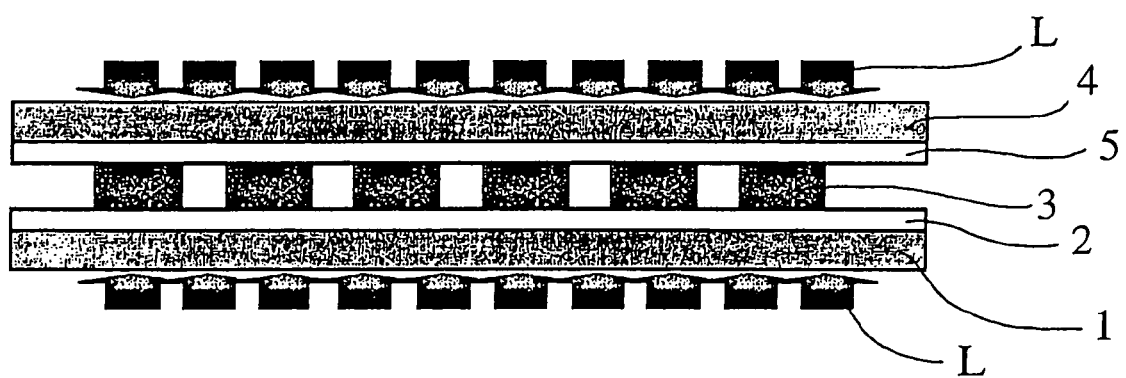
FIG. 20 is a schematic view showing a state that the thermal re-peelable layer and a thermoplastic adhesive layer are heated by laser beams according to an embodiment of the present invention.

In an embodiment, the heating of the thermal re-peelable layer 81 and the thermoplastic adhesive layer 82 is performed by overall heating using a heat source such as an oven; however, the present invention is not limited thereto. For example, as shown in FIG. 20, the thermal re-peelable layer 81 and the thermoplastic adhesive layer 82 can be heated by irradiating them with laser beams L from the back surface of the base substrate 1 and the back surface of the transfer substrate 6. To be more specific, the thermal re-peelable layer 81 is heated by irradiating the layer 81 with the laser beams L, to reduce the sticky force of the layer 81 against the devices 3. As a result, the devices 3 are peelable from the thermal re-peelable layer 81. Meanwhile, the thermoplastic adhesive layer 82 is heated by irradiating the layer 82 with the laser beams L, to be softened, thereby exhibiting the adhesive force against the devices 3. Accordingly, by stopping, when the thermoplastic adhesive layer 82 is softened, the laser irradiation, to cool and cure the layer 82, the devices 3 are fixed to the transfer substrate 83 by means of the thermoplastic adhesive layer 82. In this way, the devices 3 can be transferred from the base substrate 1 to the transfer substrate 83. In this case, each of the base substrate 1 and the transfer substrate 6 preferably has a light transmissivity because it is required to perform laser irradiation from the back surface side of each of the base substrate 1 and the transfer substrate 6 at the time of transfer of the devices 3.

Figure 21:
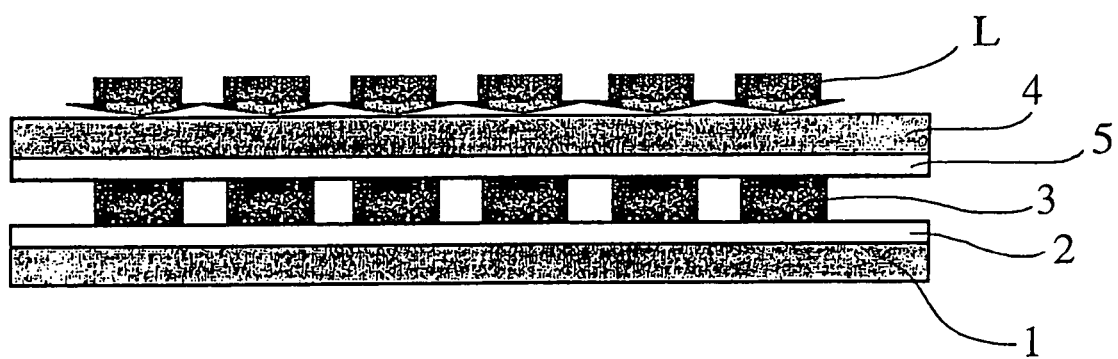
FIG. 21 is a schematic view showing a state that the devices are heated by laser beams according to an embodiment of the present invention.

In the example shown in FIG. 20, the overall surfaces of the base substrate 1 and the transfer substrate 6 are irradiated with the laser beams L; however, as shown in FIG. 21, the portions corresponding to the devices 3 may be selectively irradiated with the laser beams L. That is to say, only portions, corresponding to the devices 3 to be transferred, of each of the thermal re-peelable layer 81 and the thermoplastic adhesive layer 82 may be heated. Each of the thermal re-peelable layer 81 and the thermoplastic adhesive layer 82 may be indirectly heated by heating the devices 3. When the devices 3 to be transferred are heated by irradiating the devices 3 with the laser beams L, the heat is transferred to the thermal re-peelable layer 81 to heat the thermal re-peelable layer 81, to reduce the sticky force of the thermal re-peelable layer 81 against the devices 3, thereby making the devices 3 peelable from the layer 81. The heat of the devices 3 is also transmitted to the thermoplastic adhesive layer 82, to soften the layer 82, thereby exhibiting the adhesive force against the devices 3. Accordingly, by stopping, when the thermoplastic adhesive layer 82 is softened, the laser irradiation, to cool and cure the layer 82, whereby the devices 3 are fixed to the transfer substrate 83 by means of the thermoplastic adhesive layer 82. In this way, the devices 3 can be transferred from the base substrate 1 to the transfer substrate 83. Even in this case, the same effect as that described above can be obtained. Also, in this case, the devices 3 may be irradiated with the laser beams from the back surface side of either the base substrate 1 or the transfer substrate 6.

In this case, as shown in FIG. 21, since only the devices 3 are selectively irradiated with the laser beams from the back surface side of the transfer substrate 6, portions, other than the portions to which the devices 3 are to be fixed, of the thermoplastic adhesive layer 82 are not fluidized by softening, so that the devices 3 can be more accurately transferred. Also, the use of the laser beams makes it possible to heat very narrow portions of each of the thermal re-peelable layer 81 and the thermoplastic adhesive layer 82 for a short time, and hence to shorten the mounting time of the devices 3. Since the heated areas of each of the thermal re-peelable layer 81 and the thermoplastic adhesive layer 82 are small, such areas are not affected by the thermal contraction characteristic of the base substrate 1, so that it is possible to accurately transfer the devices 3.

Since the devices 3 can be selectively heated by laser irradiation, only a desired one of the devices 3 formed in array on the base substrate 1 can be selectively transferred, that is, the devices 3 can be selectively transferred. This makes it possible to efficiently mount the devices.

Since the devices 3 can be selectively heated by laser irradiation, even if the devices 3 are of different kinds, they can be simply transferred on the same substrate. As one example, there will be described a method of transferring devices of one kind to a substrate, on which devices of another kind are previously mounted, by using laser irradiation.

Figure 22A:
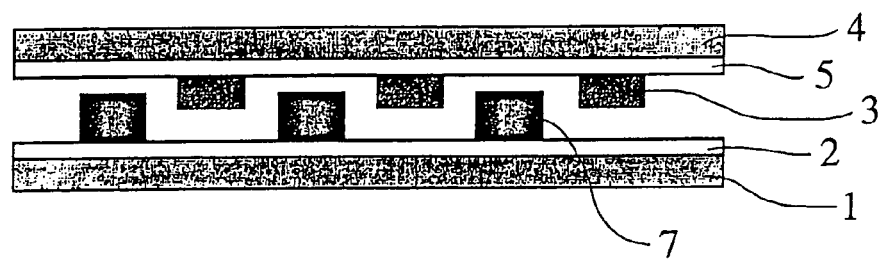

As shown in FIG. 22(a), a thermoplastic adhesive layer 82 made from a thermoplastic resin is formed on a transfer substrate 83 and devices 3 of one kind are mounted on the thermoplastic adhesive layer 82 in such a manner as to be spaced at specific intervals. Meanwhile, a thermal re-peelable layer 81 is formed on a base substrate 81 and devices 7 of another kind are arrayed on the thermal re-peelable layer 81 in such a manner as to be spaced from each other at specific intervals. Here, the height of the device 7 is set to be larger than that of the device 3.

Figure 22B:
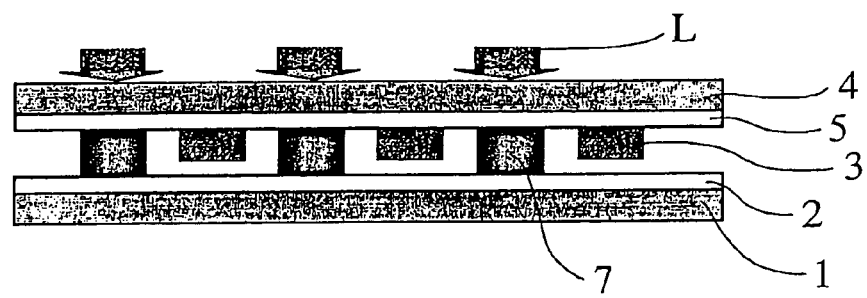

To transfer the devices 7 of another kind, as shown in FIG. 22(b), the transfer substrate 83 is disposed in a specific positional relationship with the base substrate 1 and is then brought into press-contact therewith, and in such a state, only the devices 7 are selectively irradiated with laser beams L from the back surface side of the transfer substrate 83, to be thus heated. The heat of the devices 7 is transmitted to the thermal re-peelable layer 81, to heat portions, corresponding to the devices 7, of the peelable layer 2, to reduce the sticky force of the thermal re-peelable layer 81 against the devices 7, thereby making the devices 7 peelable from the thermal re-peelable layer 81. The heat of the devices 7 is also transmitted to the thermoplastic adhesive layer 82, to soften portions, corresponding to the devices 7, of the thermoplastic adhesive layer 82. As a result, the portions, corresponding to the devices 7, of the thermoplastic adhesive layer 82 exhibit the adhesive forces against the devices 7. In this case, since the heated areas of the thermal re-peelable layer 81 are small, they are not affected by the thermal contraction characteristic of the base substrate 1, whereby the devices can be accurately positioned. When the thermoplastic adhesive layer 82 is softened, the heating is stopped, to cool and cure the thermoplastic adhesive layer 82, so that the devices 7 are fixed to the transfer substrate 83 via the thermoplastic adhesive layer 82. In this way, the devices 7 can be transferred from the base substrate 1 to the transfer substrate 83. The transfer substrate 83 is then peeled from the base substrate 1, and the thermoplastic adhesive layer 82 is cooled to room temperature, whereby the devices 3 are certainly fixed to the transfer substrate 83. The transfer step is thus accomplished.

Figure 22C:
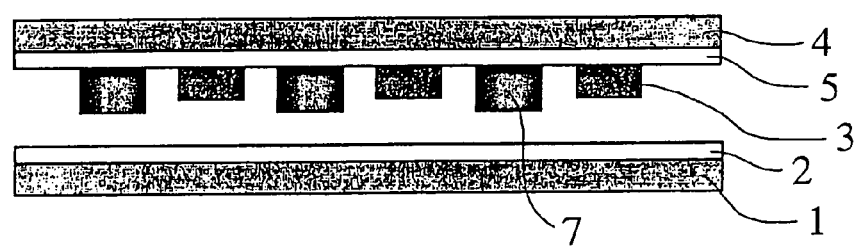

FIG. 22(*c*) shows a state after the transfer substrate 83 is peeled from the base substrate 1, wherein the devices 8 of another kind are left as transferred to the thermoplastic adhesive layer 82 in such a manner as to be located among the devices 3.

In this transfer, since the devices 3 previously mounted to the transfer substrate 83 are not irradiated with the laser beams L, and therefore, not heated, portions, corresponding to the devices 3, of the thermoplastic adhesive layer 82 are not softened. Also, since the heat of the devices 7 is not transmitted to the portions, corresponding to the devices 3 previously mounted adjacent to the devices 7, of the thermoplastic adhesive layer 82, the fixed states of the devices 3 adjacent to the devices 7 are not thermally affected. As a result, at the time of transfer of the devices 7 of another kind to the transfer substrate 83, it is possible to prevent occurrence of peeling or positional deviation of the devices 3 due to softening of the portions, corresponding to the devices 3, of the thermoplastic adhesive layer 82. In this way, the devices 7 of another kind can be accurately transferred to the transfer substrate 83, on which the devices 3 are previously mounted, without occurrence of any positional deviation of the devices 3.

Accordingly, a plurality of kinds of devices different in height can be accurately transferred to one substrate by the above-described transfer method. In this transfer method, however, as described above, the heights of devices to be transferred later are required to be larger than those of devices previously mounted to a transfer substrate.

It is to be noted that the device used for the device transferring method of the present invention is not limited to that (device 3) described in this embodiment but may be configured as an electronic part in the form of a chip in which a device is buried in an insulator such as a plastic material. Even in this case, the same effect as that described above can be obtained.

It is very useful to apply the above-described transfer method to transfer of devices in fabrication of an active matrix type image display unit.

In an active matrix type image display unit, light emitting devices of R, G, and B must be disposed adjacent to an Si transistor as a drive device by sequentially transferring the light emitting devices of R, G, and B to positions close to the Si transistor. In this transfer, however, since the Si transistor has a very high thermal conductivity, if heat is applied thereto, an inner circuit thereof may be broken. Such an inconvenience can be solved by the above-described transfer method using laser irradiation. That is to say, according to this transfer method, the transfer of heat to the Si transistor can be avoided during the step of transferring the light emitting devices of R, G, and B.

As an application example of the above-described transfer method according to an embodiment of the present invention, a device arraying method and an image display unit fabricating method using the two-step enlarged transfer method will be described below.

In an embodiment, in the concrete method of arraying light emitting devices shown in FIGS. 10 to 16, a light absorbing material for increasing a light absorptivity against laser beams is contained in each of the adhesive layers 45 and 56.

In the device arraying method and image display unit fabricating method according to an embodiment, light emitting diodes 42 are transferred to a second substrate 60 by making use of the above transfer method. As shown in FIG. 22, a thermal re-peelable layer 85 is previously formed on a principal plane of a third temporarily holding member 84 made from a material having a light transmissivity. A second temporarily holding member 47 is brought into press-contact with the third temporarily holding member 84 such that the thermal re-peelable layer 85 is opposed to the upper surface, on the side provided with an anode side electrode 49, of each light emitting diode 42 to be transferred. In such a state, a portion, corresponding to the light emitting diode 42, of a peelable layer 48 is irradiated with laser beams from the back surface side of the second temporarily holding member 47. Accordingly, if the peelable layer 48 is made from polyimide, peeling occurs by abrasion of polyimide at the interface between polyimide and a quartz substrate, with a result that the light emitting diode 42 is transferred to the thermal re-peelable layer 85 of the third temporarily holding member 84.

Figure 23:
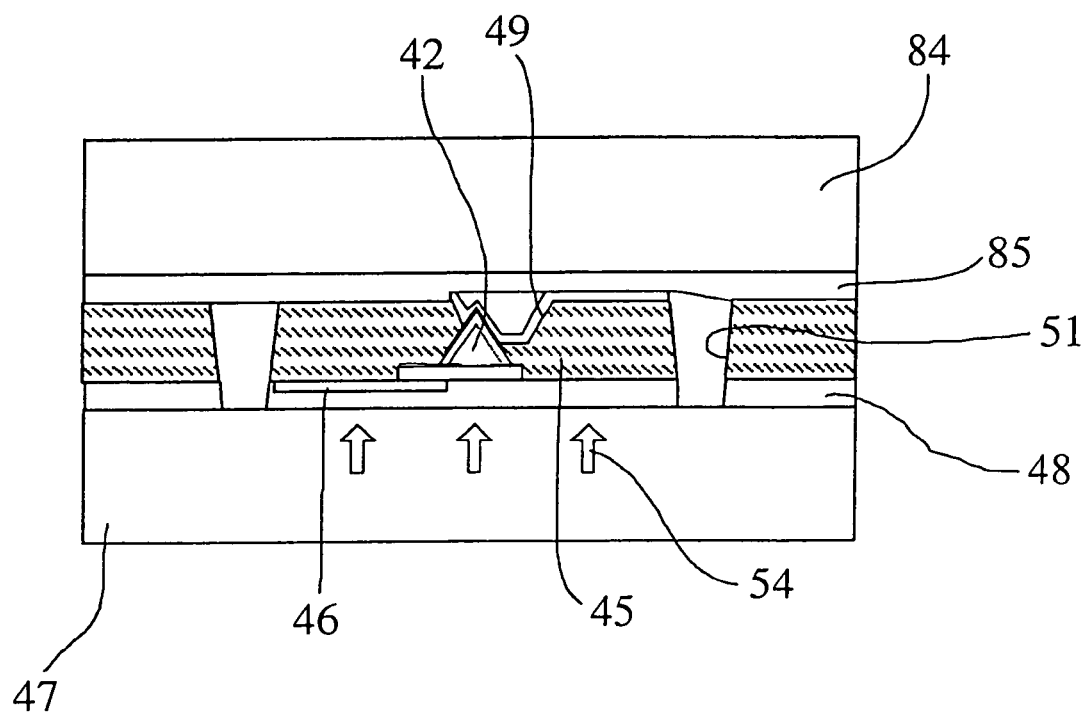
FIG. 23 is a schematic sectional view showing a second transferring step according to an embodiment of the present invention.
Figure 24:
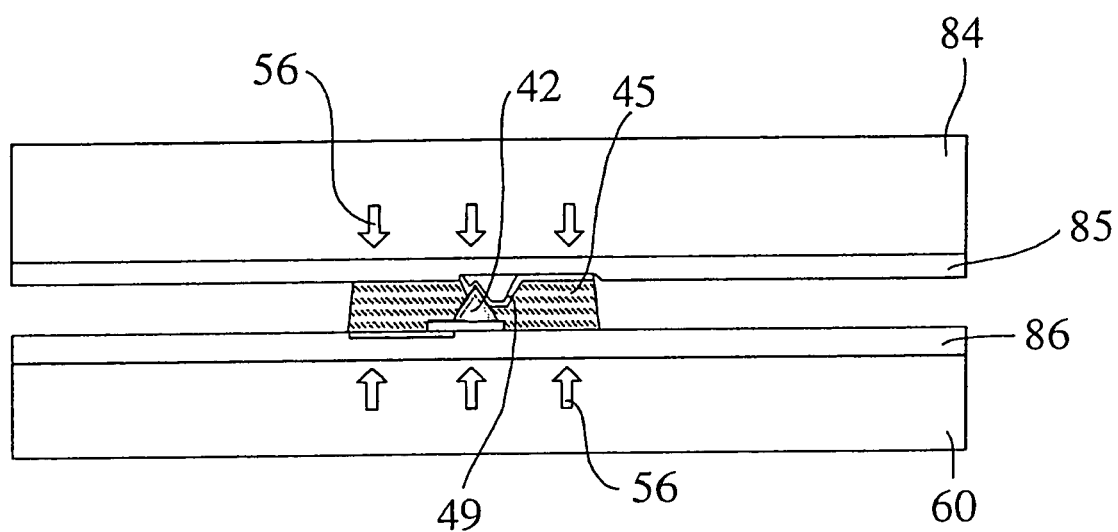
FIG. 24 is a schematic sectional view showing the second transferring step according to an embodiment of the present invention.

As shown in FIG. 23, a thermoplastic adhesive layer 86 is previously formed on the second substrate 60. The second substrate 60 is disposed in a specific positional relationship with the third temporarily holding member 84 such that the light emitting diodes 42 are opposed to the thermoplastic adhesive layer 86. Subsequently, as shown in FIG. 24, only a portion, corresponding to the resin-covered chip (light emitting diode 42 covered with an adhesive layer 45) to be transferred, of the thermal re-peelable layer 85 is irradiated with laser beams 56 from the back surface side of the third temporarily holding member 84 to be thus heated, and simultaneously only a portion, corresponding the resin-covered chip, of the thermoplastic adhesive layer 86 is irradiated with the laser beams 56 from the back surface side of the second substrate 60 to be thus heated. As a result, the sticky force of the portion, corresponding to the resin-covered chip, of the thermal re-peelable layer 85 against the resin-covered chip is reduced, whereby the resin-covered chip becomes peelable from the thermal re-peelable layer 85. The portion, corresponding to the resin-covered chip, of the thermoplastic adhesive layer 86 is softened by laser irradiation. The softened portion of the thermoplastic adhesive layer 86 is then cooled to be cured, whereby the resin-covered chip is fixed to the second substrate 60.

Figure 25:
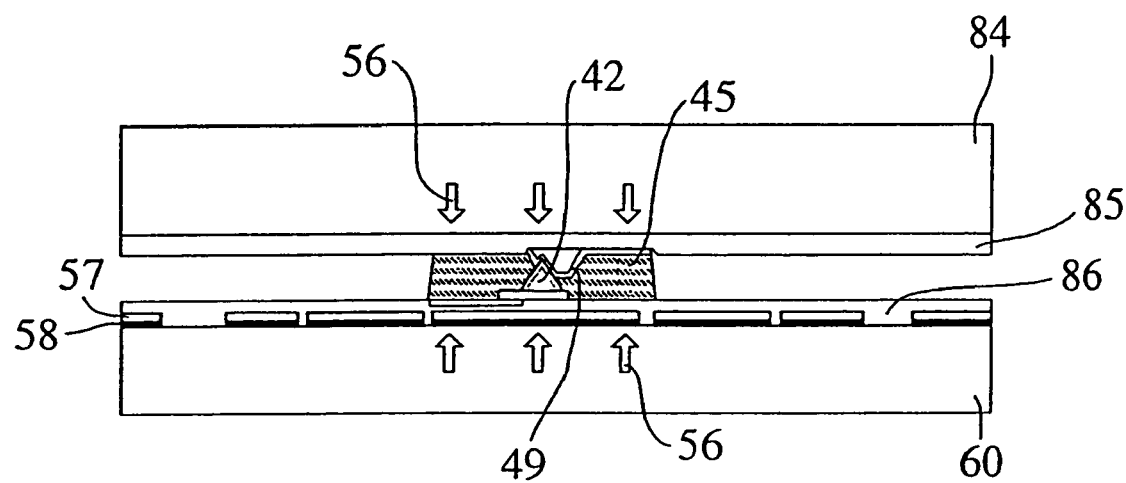
FIG. 25 is a schematic sectional view showing one application example of the second transferring step according to an embodiment of the present invention.

An electrode layer 57 serving as a shadow mask may be disposed on the second substrate 60. In this case, by irradiating a portion, corresponding to the target portion of the thermoplastic adhesive layer 86, of the electrode layer 57 with the laser beams 56 so as to heat the portion of the electrode layer 57, the target portion of the thermoplastic adhesive layer 86 can be indirectly heated. In particular, as shown in FIG. 25, a black chromium layer 58 may be formed on a surface, on the screen side, that is, on the viewer side, of the electrode layer 57. With this provision of the black chromium layer 58, it is possible to improve the contrast of an image, and also to increase an energy absorptivity of the electrode layer 57 via the black chromium layer 58 and hence to efficiently heat the target portion of the thermoplastic adhesive layer 86 by selectively irradiated laser beams 56. After that, the same steps as those described above is repeated, to fabricate a drive panel.

According to the above-described method of arraying light emitting devices, in the transfer (second transferring step) of the resin-covered chip to the second substrate, the thermal re-peelable layer 85 and the thermoplastic adhesive layer 86 are selectively heated by laser irradiation, to be thus cured, so that only the resin-covered chip to be transferred can be certainly transferred to the second substrate without exerting adverse effect on the adhesive bonded states of other parts.

INDUSTRIAL APPLICABILITY

According to a device transferring method pursuant to an embodiment of the present invention, only devices to be transferred can be quickly shifted and with certainty and selectively transferred by selective curing of an adhesive resin due to selection laser irradiation. In the case of overall heating, there are problems associated with large variations in temperature condition of a furnace and positional condition. On the contrary, laser heating can ensure a stable heating condition, to realize stable adhesive bonding of the devices. Since an adhesive resin is not required to be selectively applied but may be overall applied, it is possible to simplify the process. Also, since other parts are not affected by selective heating of the devices to be transferred due to selective laser irradiation, the devices can be transferred without peeling and positional deviation of the other parts.

According to a device arraying method pursuant to an embodiment of the present invention, since the devices can be efficiently and with certainty transferred by using the above-described device transferring method, it is possible to readily perform enlarged transfer by means of which the devices are transferred in such a manner as to be spaced from each other with an enlarged pitch.

According to an image display unit fabricating method pursuant to an embodiment of the present invention, it is possible to efficiently re-array the light emitting devices, which have been formed on the first substrate densely, that is, with a high degree of integration, on the second substrate in such a manner as to be spaced from each other with an enlarged pitch by using the above-described device transferring method, and hence to fabricate a precise image display unit with a high productivity.

According to a device transferring method pursuant to an embodiment of the present invention, portions, corresponding to desired devices, of the adhesive layer can be selectively heated, by laser irradiation from the back surface side of the substrate, directly or indirectly via the devices or wiring without heating portions, near devices other than the devices to be transferred, of the adhesive layer. As a result, since the light absorbing material for increasing the light absorptivity of the adhesive layer against laser beams is contained in the adhesive layer or disposed in the vicinity of the adhesive layer, portions, corresponding to devices to be transferred, of the adhesive layer are allowed to more desirably absorb the laser beams, and hence to be more desirably heated. As a result, it is possible to efficiently, selectively heat the portions, corresponding to the devices to be transferred, of the adhesive layer.

Since the laser beams are absorbed by the light absorbing material having the light absorptivity against the laser beams, the laser beams do not reach the devices to be transferred, so that it is possible to prevent the devices to be transferred from being damaged by the laser beams. As a result, it is possible to select any kind and wavelength of the laser beam irrespective of the material of the device, that is, with the damage of the device by the laser beam not taken into account.

By selecting a material having a known laser beam absorption characteristic as the light absorbing material, it is possible to estimate the heat generation amount of the light absorbing material upon heating, and hence to select a material being independent of the laser beam absorption characteristic as the material of the device.

Since the material of the device is not dependent on the laser beam, it is possible to eliminate the work of selecting the material of the laser beam and hence to simply select the material of the device. Also, since the light absorptivity of the adhesive layer against laser beams can be increased by containing the light absorbing material in the adhesive material or disposing the light absorbing material in the vicinity of the adhesive layer and forming the adhesive layer over the entire surface, it is possible to simplify the process.

Since portions, corresponding to devices to be transferred, of the adhesive layer can be efficiently heated by the presence of the light absorbing material, the time required to irradiate the devices with the laser beams becomes short, and accordingly portions, near the devices to be transferred, of the adhesive layer are not heated. As a result, the desired devices can be transferred without exerting any effect on the fixed states of devices other than the devices to be transferred, that is, without peeling and positional deviation of the other devices.

According to a device arraying method pursuant to an embodiment of the present invention, since desired devices are transferred by using the above-described transferring method, the desired devices can be efficiently, certainly transferred without being damaged by laser beams. As a result, it is possible to smoothly perform enlarged transfer by means of which the desired devices are transferred in such a manner as to be spaced from each other with an enlarged pitch.

According to an image display unit fabricating method pursuant to an embodiment of the present invention, it is possible to efficiently re-array the light emitting devices, which have been formed on the first substrate densely, that is, with a high degree of integration, on the second substrate in such a manner as to be spaced from each other with an enlarged pitch by using the above-described device transferring method, and hence to fabricate a precise image display unit with a high productivity.

A device transferring method according to an embodiment of the present invention includes:

a superimposing step of superimposing a second substrate having a thermoplastic adhesive layer on a first substrate on which devices are previously fixed in array via a thermal re-peelable layer; and a heating/cooling step of heating and cooling, in a state that the devices are in contact with the thermoplastic adhesive layer, the thermal re-peelable layer and the thermoplastic adhesive layer, to make the devices peelable from the thermal re-peelable layer and simultaneously melt and cure the thermoplastic adhesive layer, thereby transferring the devices to the second substrate.

With a device transferring method according to an embodiment of the present invention, since the peeling of the devices from the first substrate and the adhesive bonding of the devices on the second substrate can be performed only by the heating process, the devices can be very simply transferred without the need of provision of members such as an attracting head and an ultraviolet irradiation apparatus required in the case of using an ultraviolet-curing type material. Since the transfer process is simple, it is possible to easily, certainly perform the positioning of the devices, and hence to accurately transfer the devices without occurrence of any positional deviation of the transferred devices.

In a device transferring method according to an embodiment of the present invention, since the peeling of the devices from the first substrate and the adhesive bonding of the devices to the second substrate can be substantially simultaneously performed only by the heating process, it is possible to realize the transfer for a short time, and hence to efficiently transfer the devices.

A device arraying method of re-arraying a plurality of devices arrayed on a first substrate to a second substrate according to an embodiment of the present invention includes:

a first transferring step of transferring the devices from the first substrate to a temporarily holding member in such a manner that the devices are spaced from each other with a pitch larger than a pitch of the devices arrayed on the first substrate and holding the devices on the temporarily holding member;

a covering step of covering the devices held on the temporarily holding member with a resin;

a dicing step of dicing the resin so as to isolate the devices from each other;

a second transferring step of transferring the resin-covered devices held on the temporarily holding member to the second substrate in such a manner that the resin-covered devices are spaced from each other with a pitch larger than a pitch of the resin-covered devices held on the temporarily holding member;

wherein the second transferring step includes:

a fixing step of fixing the resin-covered devices on a second temporarily holding member via a thermal re-peelable layer;

a superimposing step of superimposing the second substrate having a thermoplastic adhesive layer on the second temporarily holding member; and a heating/cooling step of heating and cooling, in a state that the resin-covered devices are in contact with the thermoplastic adhesive layer, the thermal re-peelable layer and the thermoplastic adhesive layer, to make the resin-covered devices peelable from the thermal re-peelable layer and simultaneously melt and cure the thermoplastic adhesive layer, thereby transferring the resin-covered devices to the second substrate.

With a device arraying method according to an embodiment of the present invention, since the devices can be efficiently, certainly performed by using the above-described device transferring method, it is possible to smoothly perform enlarged transfer by means of which the desired devices are transferred in such a manner as to be spaced from each other with an enlarged pitch.

An image display unit fabricating method of fabricating an image display unit including light emitting devices disposed in a matrix according to an embodiment of the present invention includes:

a first transferring step of transferring the light emitting devices from the first substrate to a temporarily holding member in such a manner that the light emitting devices are spaced from each other with a pitch larger than a pitch of the light emitting devices arrayed on the first substrate and holding the light emitting devices on the temporarily holding member;

a covering step of covering the light emitting devices held on the temporarily holding member with a resin;

a dicing step of dicing the resin so as to isolate the light emitting devices from each other;

a second transferring step of transferring the resin-covered devices held on the temporarily holding member to the second substrate in such a manner that the resin-covered devices are spaced from each other with a pitch larger than a pitch of the resin-covered devices held on the temporarily holding member;

wherein the second transferring step includes:

a fixing step of fixing the resin-covered devices on a second temporarily holding member via a thermal re-peelable layer;

a superimposing step of superimposing the second substrate having a thermoplastic adhesive layer on the second temporarily holding member; and a heating/cooling step of heating and cooling, in a state that the resin-covered devices are in contact with the thermoplastic adhesive layer, the thermal re-peelable layer and the thermoplastic adhesive layer, to make the resin-covered devices peelable from the thermal re-peelable layer and simultaneously melt and cure the thermoplastic adhesive layer, thereby transferring the resin-covered devices to the second substrate.

With an image display unit fabricating method according to an embodiment of the present invention, it is possible to efficiently re-array the light emitting devices, which have been formed on the first substrate densely, that is, with a high degree of integration, on the second substrate in such a manner as to be spaced from each other with an enlarged pitch by using the above-described device transferring method and device arraying method, and hence to fabricate a precise image display unit with a high productivity.

It should be understood that various changes and modifications to the presently preferred embodiments described herein will be apparent to those skilled in the art. Such changes and modifications can be made without departing from the spirit and scope of the present invention and without diminishing its intended advantages. It is therefore intended that such changes and modifications be covered by the appended claims.

The invention is claimed as follows:

1. A device transferring method of selectively transferring devices arrayed on a first substrate to a second substrate on which an adhesive resin layer is previously formed, the method comprising:

selectively heating the adhesive resin layer on the second substrate by laser irradiation from a back surface side of the second substrate; and curing a selectively heated portion of the adhesive resin layer, thereby adhesively bonding devices arrayed on the first substrate to be transferred to the second substrate, wherein the adhesive resin layer includes a thermoplastic adhesive resin, wherein after the adhesively bonding, devices on the second substrate include a red light emitting diode, a green light emitting diode, and a blue light emitting diode, and wherein the red light emitting diode does not include a hexagonal pyramid shape.

* * * * *